(12) United States Patent
Otsuka

(10) Patent No.: US 9,275,830 B2
(45) Date of Patent: Mar. 1, 2016

(54) SCANNING CHARGED PARTICLE MICROSCOPE, IMAGE ACQUISITION METHOD, AND ELECTRON DETECTION METHOD

(71) Applicant: JEOL Ltd., Tokyo (JP)

(72) Inventor: Takeshi Otsuka, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/277,948

(22) Filed: May 15, 2014

(65) Prior Publication Data

US 2015/0014527 A1 Jan. 15, 2015

(30) Foreign Application Priority Data

May 15, 2013 (JP) .................................. 2013-103301

(51) Int. Cl.
*H01J 37/22* (2006.01)
*H01J 37/28* (2006.01)
*H01J 37/244* (2006.01)

(52) U.S. Cl.
CPC ............. *H01J 37/28* (2013.01); *H01J 37/22* (2013.01); *H01J 37/244* (2013.01); *H01J 2237/063* (2013.01); *H01J 2237/15* (2013.01); *H01J 2237/2441* (2013.01); *H01J 2237/2446* (2013.01); *H01J 2237/2448* (2013.01); *H01J 2237/24465* (2013.01); *H01J 2237/24485* (2013.01); *H01J 2237/2806* (2013.01)

(58) Field of Classification Search
USPC ................................................ 250/310, 307
See application file for complete search history.

(56) References Cited

U.S. PATENT DOCUMENTS

| | | | |
|---|---|---|---|
| 3,191,028 A | 6/1965 | Crewe | |
| 6,043,491 A | 3/2000 | Ose et al. | |
| 6,498,345 B1 | 12/2002 | Weimer et al. | |
| 6,797,955 B1 | 9/2004 | Adler et al. | |
| 2002/0161534 A1* | 10/2002 | Adler et al. | ....................... 702/35 |
| 2006/0076489 A1 | 4/2006 | Ohshima et al. | |
| 2006/0186351 A1* | 8/2006 | Nishiyama | ............ H01J 37/244 250/492.1 |
| 2010/0127168 A1* | 5/2010 | Khursheed | ............. H01J 49/48 250/305 |
| 2013/0032713 A1* | 2/2013 | Barbi et al. | .................... 250/307 |

FOREIGN PATENT DOCUMENTS

| | | |
|---|---|---|
| EP | 1605492 A1 | 12/2005 |
| JP | 2003151482 A | 5/2003 |
| JP | 20054995 A | 1/2005 |
| WO | 2011009065 A2 | 1/2011 |

\* cited by examiner

*Primary Examiner* — Phillip A Johnston
*Assistant Examiner* — Hsien Tsai
(74) *Attorney, Agent, or Firm* — The Webb Law Firm

(57) ABSTRACT

A scanning charged particle microscope is offered which can selectively detect and image electrons. The scanning charged particle microscope (100) has: a source (1) of a charged particle beam (E1); an objective lens (6) for bringing the charged particle beam (E1) emitted from the source (1) into focus at a sample (S); a scanning deflector (4) for scanning the focused charged particle beam (E1) over the sample (S); a sorting portion (10) for sorting out electrons emitted at given emission angles from electrons released from the sample (S) in response to irradiation of the sample (S) by the charged particle beam (E1); an electron deflector (20) for producing a deflecting field to deflect the electrons (E2) sorted out according to their energy; a detection portion (30) for detecting the electrons (E2) deflected by the electron deflector (20); and an image creating portion (44) for creating an image, based on the results of the detection performed by the detection portion (30).

10 Claims, 16 Drawing Sheets

SCANNING CHARGED PARTICLE MICROSCOPE, IMAGE ACQUISITION METHOD, AND ELECTRON DETECTION METHOD

BACKGROUND OF THE INVENTION

1. Field of the Invention

The present invention relates to a scanning charged particle microscope, image acquisition method, and electron detection method.

2. Description of Related Art

It is known that a scanning electron microscope (SEM) is one example of scanning charged particle microscope.

In a scanning electron microscope, an electron beam derived from an electron gun is sharply focused by an objective lens, deflected by a deflection coil, and enters a sample. The electron beam entering the sample scatters within the sample, resulting in emission of electrons from the sample. The emitted electrons are different in energy, emission angle, and amount of emission, depending on the composition and morphology of the sample. Therefore, a scanned electron image reflecting composition and morphology of the sample is obtained by detecting released electrons by an electron detector while scanning the electron beam.

In such scanning electron microscopy, E-T (Everhart-Thornley) detectors and semiconductor detectors are known as electron detectors for detecting electrons.

An E-T detector has a scintillator to which a high voltage is applied. Electrons released from a sample are drawn by the potential and accelerated. Thus, the electrons enter the scintillator, producing light. The light is converted into electrons, multiplied by a photomultiplier, and detected as an electrical signal.

In a semiconductor detector, electrons released from a sample are directly entered into a PN junction semiconductor. This produces carriers across the PN junction. The carriers are detected as an electrical signal.

JP-A-2005-4995 discloses a detector capable of detecting an energy distribution of signal electrons such as backscattered electrons or secondary electrons. Scanning electron microscopy has the problem that, if the same sample is observed, individual different SEM instruments produce different scanned electron images. One cause of this is that the position at which a semiconductor detector is installed is different for each different instrument and the detected electron energy or emission angle is different for different instruments. Therefore, there is a demand for a scanning charged particle microscope capable of performing imaging under conditions where operating conditions such as detected electron energy and emission angle have been selected. For example, in the scanning electron microscope of the above-cited JP-A-2005-4995, the energy of electrons released from a sample can be selected but the emission angle of the released electrons cannot be selected.

SUMMARY OF THE INVENTION

In view of the foregoing problem, the present invention has been made. One object associated with some aspects of the invention is to offer a scanning charged particle microscope, image acquisition method, and electron detection method capable of selectively detecting and imaging electrons.

(1) A scanning charged particle microscope associated with the present invention has: a source of a charged particle beam; an objective lens for bringing the charged particle beam emitted from the source into focus at a sample; a scanning deflector for scanning the focused charged particle beam over the sample; a sorting portion for sorting out electrons emitted at given emission angles from electrons released from the sample in response to irradiation of the sample by the charged particle beam; a deflector for producing a deflecting field to deflect the sorted electrons according to energy of the electrons; a detection portion for detecting the deflected electrons; and an image creating portion for creating an image, based on the results of the detection performed by the detection portion.

According to this scanning charged particle microscope, an electron emission angle and electron energy of electrons released from a sample are selected and detected. An image can be created, based on the amount of electrons having the selected emission angle and energy.

(2) In one feature of this scanning charged particle microscope, the sorting portion may be a plate-like member having through-holes for permitting passage of the charged particle beam and slits for permitting passage of electrons released at the given emission angles.

(3) In another feature of this scanning charged particle microscope, the deflector may have electrodes for producing a static electric field in the path of electrons sorted out by the sorting portion. The deflecting field may be produced by the static electric field.

(4) In a further feature of this scanning charged particle microscope, the detection portion may have a plurality of detector element areas arranged in the direction in which electrons are deflected by the deflecting field.

(5) In an additional feature of this scanning charged particle microscope, each of the detector element areas may be shaped annularly about an optical axis of the charged particle beam.

(6) In a still other feature of this scanning charged particle microscope, the detection portion has: a first one-dimensional detector and a second one-dimensional detector arranged symmetrically with respect to an optical axis of the charged particle beam. The first one-dimensional detector extends in a radial direction about the optical axis of the charged particle beam. The radial direction may be the direction in which electrons are deflected by the deflecting field.

(7) In a yet other feature of this scanning charged particle microscope, the detection portion may have a plurality of semiconductor detectors arranged in the direction in which electrons are deflected by the deflecting field. A secondary electron detecting voltage may be applied to the semiconductor detectors to detect secondary electrons.

(8) In a still further feature of this scanning charged particle microscope, there may be further provided an arithmetic unit for calculating amounts of electrons from the results of detections performed by the semiconductor detectors, based on gains of the semiconductor detectors for different energy ranges of electrons. The image creating portion may create an image, based on the amounts of electrons.

(9) A further scanning charged particle microscope associated with the present invention has: a source of a charged particle beam; an objective lens for bringing the charged particle beam emitted from the source into focus at a sample; a scanning deflector for scanning the focused charged particle beam over the sample; a detection portion for detecting electrons released from the sample in response to irradiation of the sample by the charged particle beam; and an image creating portion for creating an image, based on the results of the detection performed by the detection portion. The detection portion has a semiconductor detector for detecting electrons. A secondary electron detecting voltage is applied to the semiconductor detector to detect secondary electrons.

In this scanning charged particle microscope, the secondary electron detecting voltage is applied to the semiconductor detector to detect secondary electrons. Therefore, secondary electrons having low energies can be accelerated and made to impinge on the semiconductor detector. Consequently, secondary electrons having low energies can be detected and imaged.

(10) An image acquisition method associated with the present invention is implemented to obtain an image by scanning a charged particle beam over a sample and detecting electrons released from the sample. This method starts with sorting out electrons released at given emission angles from the electrons released from the sample. A deflecting field is produced to deflect the sorted electrons according to their energy. The deflected electrons are detected and imaged.

According to this image acquisition method, emission angles and energies of electrons released from the sample are selectively detected. An image can be generated based on the amounts of the electrons of the selected emission angle and energy.

(11) In one feature of this image acquisition method, the step of sorting out electrons released at given emission angles may be carried out using a plate-like member having through-holes for permitting passage of the charged particle beam and slits for permitting passage of the electrons released at the given emission angles.

(12) In another feature of this image acquisition method, the step of producing the deflecting field to deflect the sorted electrons according to their energy may be carried out by producing a static electric field in the path of the electrons sorted out as having the given emission angles.

(13) In a further feature of this image acquisition method, the step of detecting and imaging the deflected electrons may be carried out using a detector having a plurality of detector element areas arranged in the direction in which electrons are deflected by the deflecting field.

(14) In an additional feature of this image acquisition method, each of the detector element areas may be shaped annularly about an optical axis of the charged particle beam.

(15) In a still other feature of this image acquisition method, the step of detecting and imaging the deflected electrons may be carried out using a first one-dimensional detector and a second one-dimensional detector arranged symmetrically with respect to an optical axis of the charged particle beam. The first one-dimensional detector extends in a radial direction about the optical axis of the charged particle beam. The radial direction may be the direction in which electrons are deflected by the deflecting field.

(16) In a yet other feature of this image acquisition method, the step of detecting and imaging the deflected electrons may be carried out using a plurality of semiconductor detectors arranged in the direction in which electrons are deflected by the deflecting field. A secondary electron detecting voltage may be applied to the semiconductor detectors to detect secondary electrons.

(17) In a still further feature of this image acquisition method, during the step of detecting and imaging the deflected electrons, amounts of electrons may be calculated from results of detections performed by the semiconductor detectors, based on gains of the semiconductor detectors for different energy ranges of electrons and an image is created based on the amounts of electrons.

(18) Another image acquisition method associated with the present invention is implemented by scanning a charged particle beam over a sample and detecting electrons released from the sample. The electrons released from the sample are detected by a semiconductor detector to which a secondary electron detecting voltage is applied to detect secondary electrons. An image is created based on the results of the detection performed by the semiconductor detector.

According to this image acquisition method, the secondary electron detecting voltage is applied to the semiconductor detector to detect secondary electrons. Therefore, secondary electrons having low energies can be accelerated and made to impinge on the semiconductor detector. Consequently, secondary electrons having low energies can be detected and imaged.

(19) An electron detection method associated with the present invention is implemented to detect electrons released from a sample. The electrons released from the sample are detected by a semiconductor detector to which a secondary electron detecting voltage is applied to detect secondary electrons.

According to this electron detection method, the secondary electron detecting voltage is applied to the semiconductor detector to detect secondary electrons. Therefore, secondary electrons having low energies can be accelerated and made to impinge on the semiconductor detector. Hence, secondary electrons having low energies can be detected by the semiconductor detector.

(20) In one feature of this electron detection method, in order to release electrons from the sample, the sample is irradiated with a charged particle beam.

DESCRIPTION OF THE INVENTION

The preferred embodiments of the present invention are hereinafter described in detail with reference with the drawings. It is to be understood that the embodiments described below do not unduly restrict the content of the present invention set forth in the appended claims and that configurations described below are not always essential constituent components of the invention.

1. First Embodiment

1.1. Configuration of Scanning Charged Particle Microscope

Figure 1:
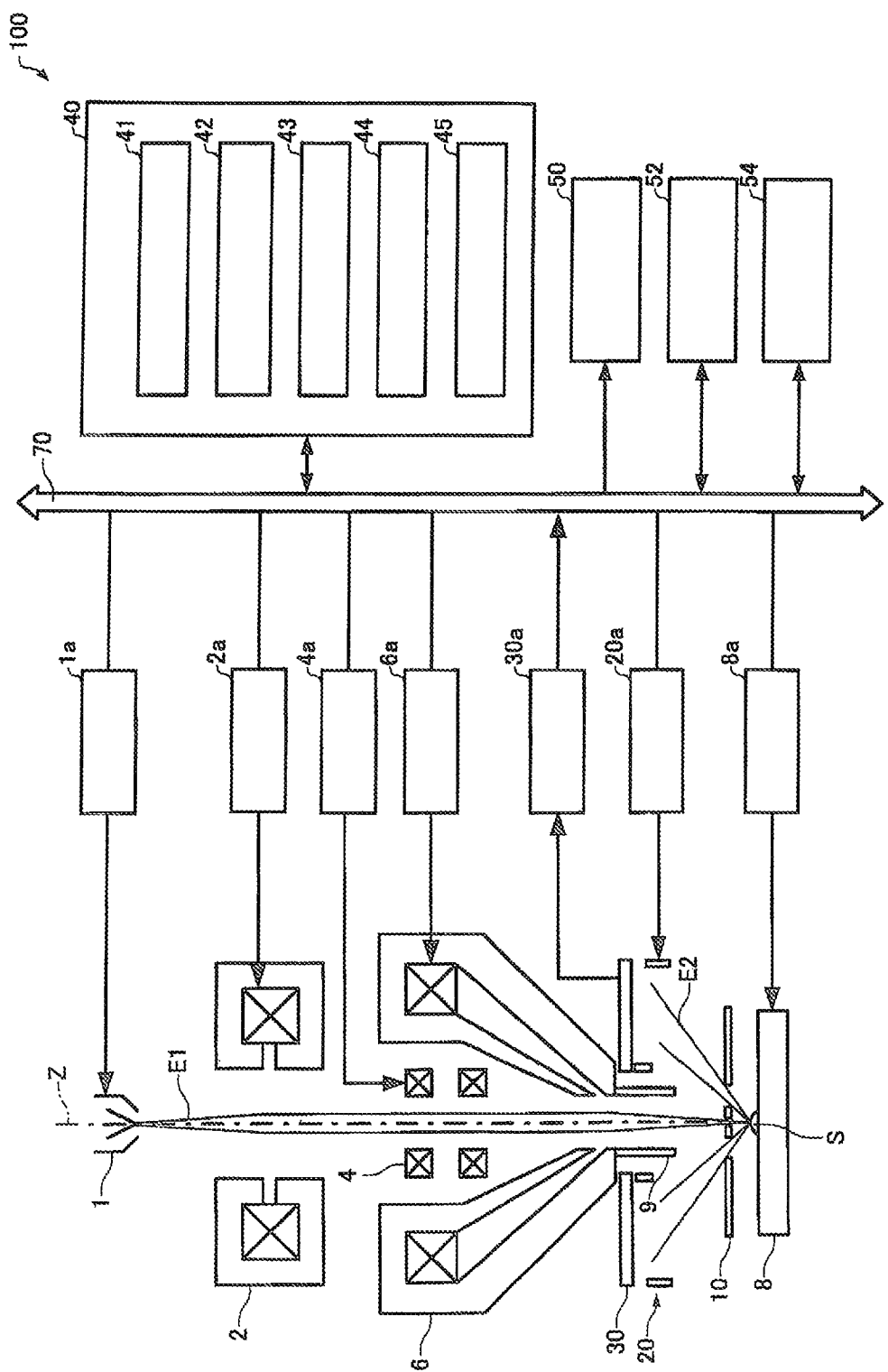
FIG. 1 is a block diagram of a scanning charged particle microscope associated with a first embodiment of the present invention.

The configuration of a scanning charged particle microscope associated with a first embodiment of the present invention is first described by referring to FIG. 1, where the scanning charged particle microscope is generally indicated by reference numeral 100.

As shown in FIG. 1, the scanning charged particle microscope 100 is configured including an electron beam source (source of a charged particle beam) 1, condenser lenses 2, a scanning deflector 4, an objective lens 6, a sample stage 8, a center pipe 9, an electron angle sorting portion 10, an electron deflector 20, an electron detection portion 30, signal processing circuitry 40, a display portion 50, a manual control portion 52, and a storage portion 54.

The scanning charged particle microscope 100 obtains a scanned electron image by scanning a charged particle beam E1 over a sample S and detecting electrons E2 released from the sample S by scattering of the charged particle beam E1 within the sample S. It is now assumed that the scanning charged particle microscope 100 is a scanning electron microscope (SEM).

The electron beam source 1 emits the electron beam (primary electron beam) E1. For example, the electron beam source 1 is a well-known electron gun, and emits the electron beam E1 by accelerating electrons released from a cathode by means of an anode. No restrictions are imposed on the electron gun used as the electron beam source 1. For instance, a thermionic electron gun, a thermal field emission electron gun, a cold field emission electron gun, or the like can be used as the electron beam source 1. An accelerating voltage is applied to the electron beam source 1 from a driver portion 1a to accelerate electrons released from the cathode. The accelerating voltage is 1 to 3 kV, for example. The electron beam E1 released from the electron beam source 1 travels along the optical axis Z of the scanning charged particle microscope 100.

The condenser lenses 2 are disposed behind (downstream along the electron beam E1) the electron beam source 1. The lenses 2 are used to focus the electron beam E1.

The scanning deflector 4 including scan coils is disposed behind the condenser lenses 2. The scanning deflector 4 is made of electromagnetic coils and used such that the electron beam E1 focused by the condenser lenses 2 and objective lens 6 is scanned over the sample S. The scanning deflector 4 can scan the electron beam E1 over the sample S by deflecting the electron beam E1, based on a scan signal generated by a scan signal generator 41.

The objective lens 6 is disposed behind the scanning deflector 4. The objective lens 6 focuses the electron beam E1 and directs it at the sample S.

The sample stage 8 can hold the sample S thereon and move it. The sample stage 8 can horizontally move, vertically move, rotate, and tilt the sample S, for example.

The electron beam source 1, condenser lenses 2, scanning deflector 4, objective lens 6, and sample stage 8 are controllably energized by driver portions 1a, 2a, 4a, 6a, and 8a, respectively. These driver portions 1a, 2a, 4a, 6a, and 8a are connected with a bus line 70, and are supplied with driver signals from a controller 45 via the bus line 70. The driver portions 1a, 2a, 4a, 6a, and 8a drive the electron beam source 1, condenser lenses 2, scanning deflector 4, objective lens 6, and sample stage 8, respectively, based on the supplied driver signals.

Electrons (such as secondary electrons and backscattered electrons) E2 are emitted from the sample S when the electron beam E1 hits the sample S. The electron angle sorting portion 10 sorts out electrons released at given emission angles from these electrons E2.

Figure 2:
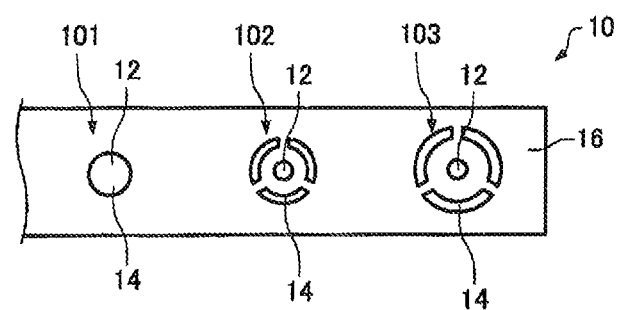
FIG. 2 is a schematic representation of an electron angle sorting portion included in the microscope shown in FIG. 1.

FIG. 2 is a schematic representation of the electron angle sorting portion 10, as viewed along the direction of travel of the electron beam E1. The electron angle sorting portion 10 is made of a plate-like member 16 having through-holes 12 for permitting passage of the electron beam E1 and slitted portions 14 for permitting passage of the electrons E2 released at the given angles. The plate-like member 16 is made, for example, of a metal. In the illustrated example, the plate-like member 16 has a rectangular planar form.

Each of the slitted portions 14 consists of one or more slits formed annularly around a respective one of the through-holes 12. In the illustrated example, the slitted portions 14 of the plate-like member 16 include a slitted portion 101 for sorting out electrons E2 released at high angles, another slitted portion 102 for sorting out electrons E2 released at moderate angles, and a further slitted portion 103 for sorting out electrons E2 released at low angles. In the illustrated example, the slitted portions 101, 102, and 103 are arranged along the longer sides of the plate-like member 16.

Figure 3:
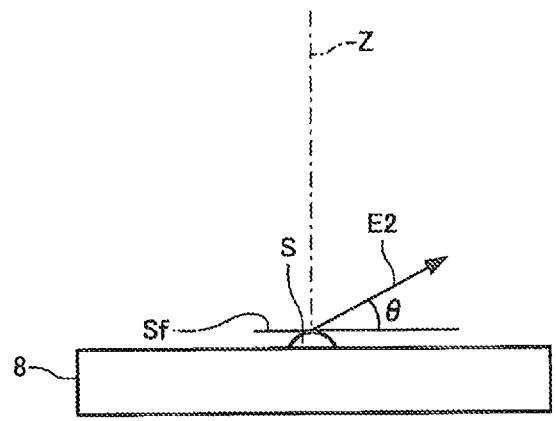
FIG. 3 is a diagram illustrating an emission angle θ.

The emission angles referred to herein are described by referring to FIG. 3. The emission angles θ are the angles at which the electrons E2 are emitted with respect to a sample surface Sf that is perpendicular to the optical axis Z of the scanning charged particle microscope 100.

The slitted portion 101 for high angles has the corresponding slit 14 for sorting out the electrons E2 released at angles θ, for example, of 60 to 75°. In the slitted portion 101 for high angles, the electrons E2 released at angles θ of 60 to 75° pass through the slit 14. Electron E2 released at other angles θ are blocked by the plate-like member 16. In the slitted portion 101 for high angles and shown in FIG. 2, the through-hole 12 and slit 14 are integral with each other.

The slitted portion 102 for moderate angles has the respective slits 14 for sorting out electrons E2 released at angles θ, for example, of 40 to 50°. In the slitted portion 102 for moderate angles, electrons E2 released at angles θ of 40 to 50° pass through the slits 14, while electrons E2 released at other angles θ are blocked by the plate-like member 16. The slitted portion 102 for moderate angles has the slits 14 formed along an imaginary circle (not shown) around the through-hole 12.

The slitted portion 103 for low angles has the respective slits 14 for sorting out electrons E2 released at angles θ, for example, of 15 to 25°. In the slitted portion 103 for low angles, the electrons E2 released at emission angles θ of 15 to 25° pass through the slits 14, while electrons E2 released at other emission angles θ are blocked by the plate-like member 16. In the slitted portion 103 for low angles, the slits 14 are formed along an imaginary circle (not shown) around the through-hole 12, the imaginary circle being greater in radius than the imaginary circle of the slitted portion 102 for moderate angles.

These slitted portions 101, 102, and 103 are switchably used. Electrons E2 having desired emission angles can be sorted out by selectively using the slitted portions 101, 102, and 103. For example, the active slitted portion can be selected from among the slitted portions 101-103, for example, by moving the plate-like member 16 longitudinally manually or by a mechanical drive (not shown).

Preferably, the electron angle sorting portion 10 sorts out electrons E2 before the emission angles of electrons E2 are affected by the magnetic field produced by the objective lens 6. Accordingly, it is desired that the sorting portion 10 be placed near the sample S.

Figure 4:
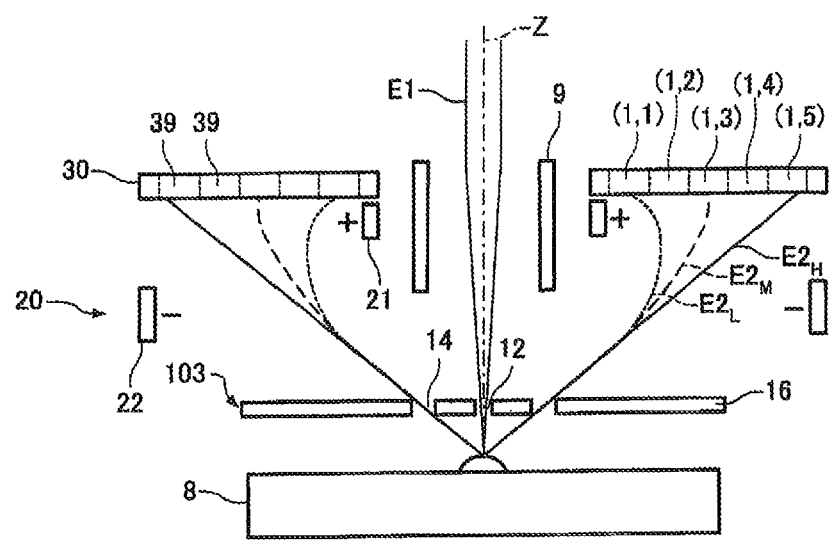
FIG. 4 is a schematic representation of an electron angle sorting portion (slitted portion for low angles), an electron deflector, and an electron detection portion according to the first embodiment.
Figure 5:
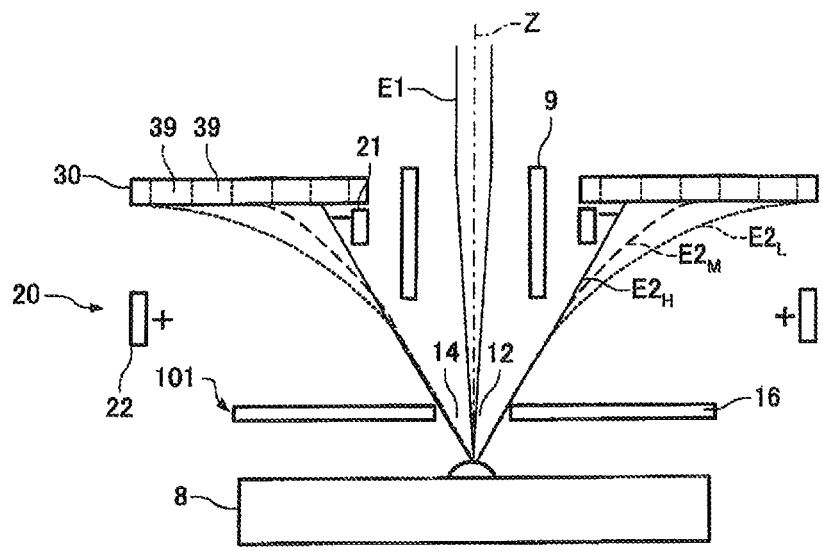
FIG. 5 is a schematic representation of an electron angle sorting portion (slitted portion for large angles), the electron deflector, and the electron detection portion according to the first embodiment.
Figure 6:
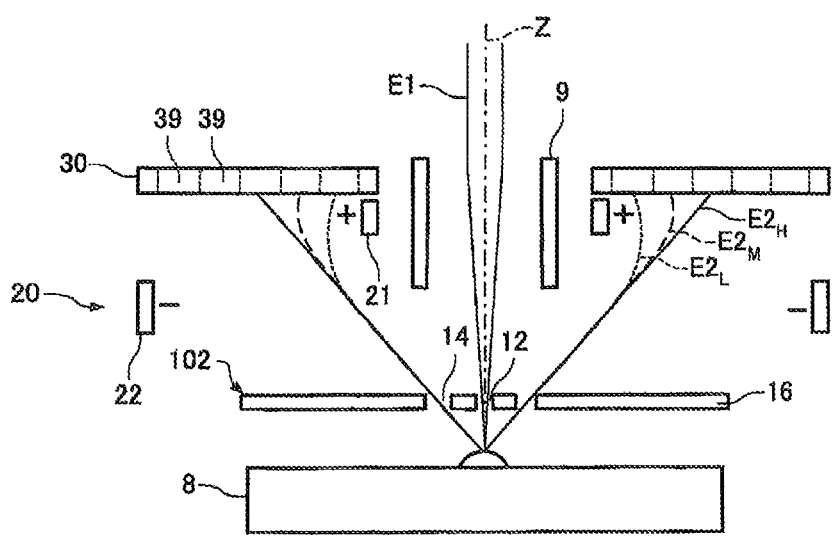
FIG. 6 is a schematic representation of an electron angle sorting portion (slitted portion for middle angles), the electron deflector, and the electron detection portion according to the first embodiment.

The electron deflector 20 produces a deflecting field such that the electrons E2 sorted out by the electron angle sorting portion 10 are deflected according to the energies of the electrons E2. FIGS. 4, 5, and 6 are schematic representations of the electron angle sorting portion 10, electron deflector 20, and electron detection portion 30. FIG. 4 shows a case in which the slitted portion 103 for low angles is used. FIG. 5 shows a case in which the slitted portion 101 for high angles is used. FIG. 6 shows a case in which the slitted portion 102 for moderate angles is used. In FIGS. 4-6, the orbit of electrons $E2_H$ (such as backscattered electrons) having high energies is indicated by solid lines. The orbit of electrons $E2_L$ (such as secondary electrons) having low energies is indicated by dotted lines. The orbit of electrons $E2_M$ having moderate energies is indicated by broken lines.

The electron deflector 20 produces a deflecting field such that the electrons E2 sorted by the electron angle sorting portion 10 are deflected according to the energies of the electrons E2. In the illustrated example, the electron deflector 20 is configured including an inner electrode 21 and an outer electrode 22. The inner electrode 21 is a cylindrical electrode whose center axis lies on the optical axis Z of the scanning charged particle microscope 100. The outer electrode 22 is a cylindrical electrode whose center axis lies on the optical axis Z and which is greater in diameter than the inner electrode 21.

In the electron deflector 20, a driver portion 20a (see FIG. 1) applies a voltage between the inner electrode 21 and the outer electrode 22 to produce a static electric field in the path of the electrons E2. This in turn gives rise to a deflecting field, thus deflecting the electrons E2. As shown in FIGS. 4-6, the electrons $E2_L$ having lower energies are deflected to a greater extent by the static, deflecting field but the electrons $E2_H$ having higher energies are deflected to a lesser extent. That is, electrons E2 having smaller energies are deflected to a greater extent by the static electric field set up between the electrodes 21 and 22. In this example, the static electric field generated between the electrodes 21 and 22 is used to deflect the electrodes E2. The technique of deflecting the electrons E2 is not restricted to this method.

As shown in FIG. 4, where the slitted portion 103 for low angles is used, a positive voltage is applied to the inner electrode 21 and a negative voltage is applied to the outer electrode 22 in the electron deflector 20. In particular, when a voltage of +500 V is impressed on the electron detection portion 30 and the slitted portion 103 for low angles is used, a voltage of +500±50 V and a voltage of −1300±50 V, for example, are applied to the inner electrode 21 and outer electrode 22, respectively. The voltage of +500 V applied to the electron detection portion 30 is used such that electrons E2 of low energies are accelerated and detected as described later. Since a positive voltage is applied to the inner electrode 21 and a negative voltage is applied to the outer electrode 22, electrons E2 having lower energies are deflected closer to the inner electrode 21. Therefore, electrons E2 having lower energies enter the detector element area 39 closer to the inner electrode 21 of the electron detection portion 30 (i.e., closer to the inner end of the electron detection portion 30).

When the slitted portion 101 for high angles is used as shown in FIG. 5, a negative voltage is applied to the inner electrode 21 and a positive voltage is applied to the outer electrode 22 in the electron deflector 20. In particular, when a voltage of +500 V is applied to the electron detection portion 30 and the slitted portion 101 for high angles is used, a negative voltage of −200±50 V and a positive voltage of +500±50 V, for example, are applied to the inner electrode 21 and outer electrode 22, respectively. As a result, electrons E2 having lower energies are deflected closer to the outer electrode 22. Consequently, the electrons E2 having lower energies enter the detector element area 39 closer to the outer electrode 22 of the electron detection portion 30 (i.e., closer to the outer fringe of the electron detecting portion 30).

The electron detection portion 30 can be reduced in size by applying a positive voltage and a negative voltage to the inner electrode 21 and the outer electrode 22, respectively, as shown in FIG. 4 when the slitted portion 103 for low angles is used and applying a negative voltage and a positive voltage to the inner electrode 21 and the outer electrode 22, respectively, as shown in FIG. 5 when the slitted portion 101 for high angles is used. The reason is described below.

When the slitted portion 103 for low angles is used, if a negative voltage and a positive voltage are applied to the inner electrode 21 and the outer electrode 22, respectively, the electrons $E2_M$ of moderate energies and the electrons $E2_L$ of lower energies travel in an unillustrated manner outside (closer to the outer electrode 22) the orbit of the electrons $E2_H$ of higher energies shown in FIG. 4. When the slitted portion 101 for high angles is used, the same phenomenon occurs as illustrated in FIG. 5.

When the slitted portion 101 for high angles is used, if a positive voltage and a negative voltage are applied to the inner electrode 21 and the outer electrode 22, respectively, the electrons $E2_M$ of moderate energies and the electrons $E2_L$ of lower energies travel in an unillustrated manner inside the orbit of the electrons $E2_H$ of higher energies (i.e., closer to the inner electrode 21) shown in FIG. 5. When the slitted portion 103 for low angles is used, the same phenomenon takes place as illustrated in FIG. 4.

In this way, when either the slitted portion 103 for low angles or the slitted portion 101 for high angle is used, if voltages applied to the inner electrode 21 and the outer electrode 22 have the same polarity, it is necessary to increase the size of the electron detection portion 30. In contrast, the electron detection portion 30 of the present embodiment does not suffer from this problem.

When the slitted portion 102 for moderate angles is used as shown in FIG. 6, a positive voltage and a negative voltage are applied to the inner electrode 21 and the outer electrode 22, respectively, in the electron deflector 20. In particular, when a voltage of +500 V is applied to the electron detection portion 30 and the slitted portion 102 for moderate angles is used, a positive voltage of +300±50 V and a negative voltage of −500±50 V are applied to the inner electrode 21 and outer electrode 22, respectively. Consequently, electrons E2 having lower energies are deflected closer to the inner electrode 21. Hence, the electrons E2 of lower energies enter the detector element area 39 closer to the inner electrode 21 of the electron detection portion 30 (i.e., closer to the inner fringe of the electron detection portion 30).

When the sated portion 102 for moderate angles is used, a negative voltage and a positive voltage may be applied to the inner electrode 21 and the outer electrode 22, respectively.

The electron deflector 20 is under control of the controller 45 which, in turn, generates a control signal for controlling the electron deflector 20. The control signal is fed to the driver portion 20a via the bus line 70. The driver portion 20a applies voltages to the electrodes 21 and 22, based on the control signal.

The center pipe 9 is mounted inside the inner electrode 21 to prevent the electron beam E1 from being affected (such as focused or deflected) by the electrostatic field (deflecting field) between the electrodes 21 and 22. The center pipe 9 has electrical conductivity and is nonmagnetic.

Figure 7:
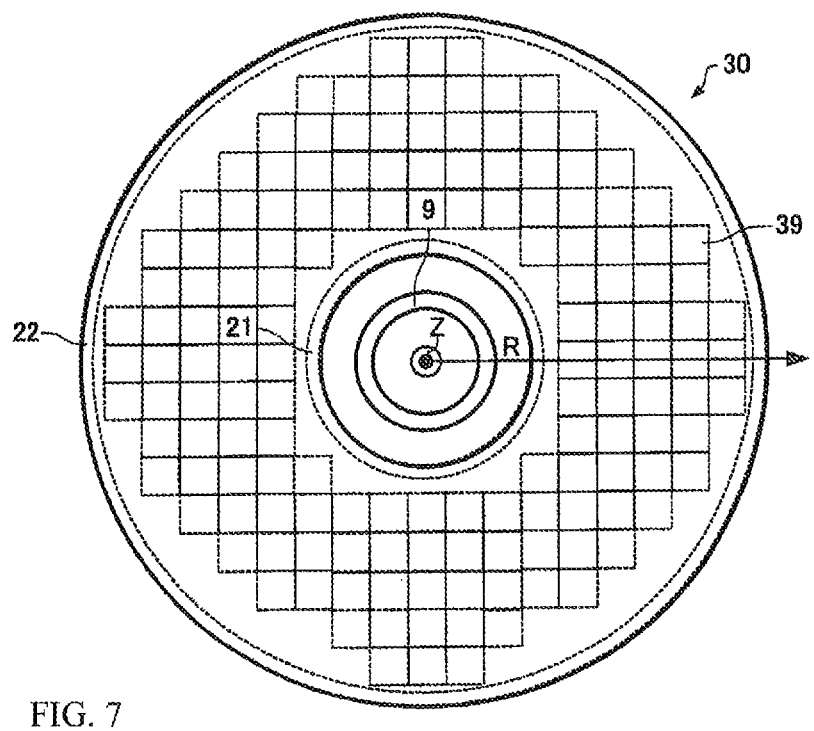
FIG. 7 is a schematic representation of the electron detection portion according to the first embodiment.

The electron detection portion 30 detects electrons E2 deflected by the electron deflector 20. FIG. 7 is a schematic representation of the electron detection portion 30.

As shown in FIG. 7, the electron detection portion 30 is a disklike member centered at the optical axis Z. The electron detection portion 30 is centrally provided with a hole for permitting passage of the electron beam E1. The electron detection portion 30 is a detector having position resolution. In particular, the electron detection portion 30 is a two-dimensional detector having position resolution within a plane perpendicular to the optical axis Z. In the illustrated example, the electron detection portion 30 can two-dimensionally detect the position of the electrons E2 entering the detection portion 30 after passing through the region between the inner electrode 21 and the outer electrode 22. That is, the electron detection portion 30 can identify the positions at which the electrons E2 are detected. In the illustrated example, the electron detection portion 30 has the detector element areas 39 arranged in rows and columns. Each detector element area 39 detects the electrons E2. Consequently, the positions of the electrons E2 and amounts the electrons E2 at these positions can be detected. In the illustrated example, the detector element areas 39 are arranged in rows and columns. No restriction is imposed on the arrangement of the detector element areas 39. Also, no restriction is placed on the number of detector element areas 39.

The electron detection portion 30 may be a detector composed of a microchannel plate (MCP), a fluorescent plate made to fluoresce by electrons multiplied by the MCP, and a CCD image sensor for imaging the fluorescent plate. Also, the electron detection portion 30 may be a detector that is a combination of an MCP and multiple anodes.

Where the detector elements used in the electron detection portion 30 show low sensitivity to low-energy electrons, positive high voltages may be applied to the detector elements. In this method, the electrons E2 are accelerated and enter the detector elements and so the electrons can be detected if they have low energies just when they are released from the sample S. For example, a voltage on the order of +500 V is applied to the electron detection portion 30.

The electrons E2 entering the electron detection portion 30 are deflected in the electron detector 20 according to energy as described previously. The direction of deflection of the electrons E2 deflected by the electron deflector 20 is a radial direction R of the electron detection portion 30. Therefore, in the electron detection portion 30, each position (incident position) in the radial direction R at which electrons E2 are detected corresponds to the energy of the detected electrons E2. That is, in the illustrated example, the distance between the center (optical axis Z) of the electron detection portion 30 and the position on the electron detection portion 30 at which the incident electrons E2 are detected corresponds to the energy of the detected electrons E2.

The output signal (including position information and information about the amounts of electrons detected at detector element positions (hereinafter may be referred to as detection amount information)) from the electron detection portion 30 in response to the detected electrons E2 is converted into a digital signal by an A/D converter 30a as shown in FIG. 1 and output to the bus line 70.

The results of processing performed by the signal processing circuitry 40 are displayed as characteristics, graphs, or other information on the display portion 50, based on the display signal entered from the signal processing circuitry 40 via the bus line 70. For example, the display portion 50 displays a scanned electron image created by a scanned electron image generator 44. The display portion 50 is a CRT, LCD, touch panel display, or the like.

The manual control portion 52 obtains a control signal responsive to a user's manipulation and sends the signal to the signal processing circuitry 40 via the bus line 70. For example, the manual control portion 52 is a button, key, touch panel display, microphone, or the like.

Programs and data for causing the signal processing circuitry 40 to perform various kinds of computational processing and control operations are stored in the storage portion 54. The storage portion 54 is also used as a working area of the signal processing circuitry 40. The working area is used to temporarily store the control signal entered from the manual control portion 52, the results of computations executed by the signal processing circuitry 40 in accordance with various programs, and so on. The storage portion 54 is connected with the bus line 70.

The signal processing circuitry 40 performs various types of computational processing in accordance with programs stored in the storage portion 54. The functions of the signal processing circuitry 40 can be realized by various processors (such as CPU or DSP), hardware (such as ASIC, e.g., a gate array), or software. The signal processing circuitry 40 is connected with the bus line 70.

In the present embodiment, the signal processing circuitry 40 operates as the scan signal generator 41, a detector element distribution array acquisition portion 42, an array calculator 43, the scanned electron image generator 44, and the controller 45 described below by executing a program stored in the storage portion 54. At least a part of the signal processing circuitry 40 may be realized in hardware or dedicated hardware circuitry.

The scan signal generator 41 generates a scan signal, which is sent to the driver portion 4a via the bus line 70. Based on the scan signal, the scanning deflector 4 deflects the electron beam E1 and scans the electron beam E1 over the sample S.

The detector element distribution array acquisition portion 42 obtains information about the positions on the electron detection portion 30 at which the electrons E2 are detected and information about the amounts of detection at these positions. The array acquisition portion 42 obtains these kinds of information from the output signal from the electron detection portion 30. The detector element distribution array acquisition portion 42 creates a detector element distribution array $Id_{ij}$, based on the detection position information and detection amount information about the electrons E2.

In the detector element distribution array the positions at which the electrons E2 are detected and the amounts of electrons detected at these positions are interrelated. In particular, the positions of the detector element areas 39 where the electrons E2 are detected and the amounts of electrons detected at these detector element areas 39 are interrelated in the detector element distribution array $Id_{ij}$, where ij indicates the position of each detector element, i.e., the position of each detector element area 39 where the electrons E2 are detected.

The array calculator 43 calculates the total amount sd of electrons detected at specified detector element area 39. Specifically, the array calculator 43 specifies the detector element area 39 using a detector element specifying array $Ia_{ij}$ and finds the total amount sd of electrons detected by the detector element area 39 specified by the detector element specifying array $Ia_{ij}$ from the detector element distribution array $Id_{ij}$.

The detector element specifying array $Ia_{ij}$ is used to specify detector element areas 39 for obtaining information about amount of detection from the detector element distribution array $Id_{ij}$. The detector element specifying array $Ia_{ij}$ is identical in size with the detector element distribution array $Id_{ij}$. The values of the elements of the array are composed of 0's and 1's; A value of 1 is entered for every detector element area 39 from which information about the amount of detection is obtained. A value of 0 is entered for every detector element area 39 from which no information is obtained. The use of the detector element specifying array $Ia_{ij}$ makes it possible to extract detector element areas (amount of detection) 39 from the elements (amounts of detected electrons) of the detector element distribution array $Id_{ij}$ detected in a given detector element area 39.

Plural detector element specifying arrays $Ia_{ij}$'s are previously stored in the storage portion 54. For example, a user can select any desired detector element specifying array according to the energy range of the electrons E2. If a finer detector element area is specified, the user may display a desired detector element distribution array $Id_{ij}$ in a more easily understandable format (e.g., an image or a graph) on the display portion 50. The user may set the detector element specifying array $Ia_{ij}$ while checking the displayed format.

The array calculator 43 calculates the total amount sd of electrons detected by the detector element areas 39 specified by the detector element specifying array $Ia_{ij}$ using the detector element distribution array $Id_{ij}$ according to the following Eq. (1).

$$sd = \sum_j \sum_i Id_{ij} Ia_{ij} \quad (1)$$

Consequently, the total amount sd of the electrons detected by the detector element areas 39 specified by the detector element specifying array $Ia_{ij}$ can be found. That is, it is possible to find the amount sd of detected electrons E2 lying in the same energy range.

By specifying plural detector element specifying arrays $Ia_{ij}$'s, the array calculator 43 can simultaneously find the amounts sd of electrons which are detected by the detector element areas 39 specified by the plural detector element specifying arrays $Ia_{ij}$'s and which are in different energy ranges.

The scanned electron image generator 44 creates a scanned electron image, based on the amount of detection sd and a scan signal indicative of an amount of scanning. As a result, a scanned electron image is created on the basis of the amount of electrons E2 which are in a given energy range and which have been detected.

The controller 45 operates to create control signals for controlling the operation of the electron beam source 1, condenser lenses 2, scanning deflector 4, objective lens 6, sample stage 8, and electron deflector 20.

1.2. Operation of Scanning Charged Particle Microscope

The image acquisition method of the present embodiment is next described in relation to the operation of the scanning charged particle microscope.

In the scanning charged particle microscope 100, when the primary electron beam E1 is accelerated by a given accelerating voltage and released from the electron beam source 1, the released electron beam E1 is sharply focused by the lens action of the condenser lenses 2 and objective lens 6. As a result, the focused electron beam E1 (electron probe) is directed at the sample S. A scan signal generated by the scan signal generator 41 is applied to the scanning deflector 4 via the driver portion 4a. The scan deflector 4 deflects the electron beam E1 on the basis of the scan signal and scans the electron beam E1 (electron probe) over the sample S.

The electron beam E1 is deflected by the scanning deflector 4 and hits the sample S at a specified position. The electrons of the beam E1 entering the sample S are scattered within the sample S. As a result, electrons (such as secondary electrons or backscattered electrons) E2 are released from the sample S. The electrons E2 released from the sample S are different in emission angle θ (see FIG. 3), energy, or amount, depending on the composition or morphology of the sample S.

Therefore, in the scanning charged particle microscope 100, the electron angle sorting portion 10 sorts out the electrons E2 released at given emission angles θ from the electrons E2 emitted from the sample S. In particular, one is selected from the slitted portion 101 for high angles, the slitted portion 102 for moderate angles, and the slitted portion 103 for low angles shown in FIG. 2 and placed in the path of the electrons E2. As a result, the electrons E2 released at the given emission angles θ out of the electrons E2 released from the sample S pass through the slit or slits 14 (see FIGS. 4-6); the electrons E2 released at other emission angles θ are blocked by the plate-like member 16. Thus, the electrons E2 released at the given emission angles θ can be sorted out. A case in which the sated portion 103 for low angles as shown in FIG. 4 is selected is described below.

Then, a deflecting field is produced by the electron deflector 20 to deflect the electrons E2 sorted out by the electron angle sorting portion 10 according to the energies of the electrons E2. Those of the electrons E2 passed through the slit 14 which have lesser energies are deflected to a greater extent by the deflecting field present between the electrodes 21 and 22.

The electron detection portion 30 then detects the electrons E2 deflected by the electron deflector 20. The detection portion 30 is a two-dimensional detector.

The output signal from the electron detection portion 30 is converted into a digital signal by the A/D converter 30a and applied to the bus line 70. The output signal from the electron detection portion 30 contains position information about the detector element areas 39 which have detected the electrons E2 and information about the amounts of electrons detected by the detector element areas 39.

The detector element distribution array acquisition portion 42 obtains position information and detection amount information about the detector element areas 39 from the output signal from the electron detection portion 30 and creates the detector element distribution array $Id_{ij}$ from the position information and detection amount information.

The detector element distribution array $Id_{ij}$ indicates the position coordinates of the detector element areas 39 of the electron detection portion 30 by means of (i, j), where i is a coordinate in a circumferential direction of the detector element areas 39 of the electron detection portion 30 and j is a coordinate in a radial direction R of the detector element areas 39 of the electron detection portion 30. For example, where the electron detection portion 30 shown in FIG. 4 has n detector element areas 39 in the circumferential direction and 5 detector element areas 39 in the radial direction R, it follows that i=1, 2, 3, . . . , n and j=1, 2, 3, 4, 5. It is assumed that as j increases, the distance from the center (optical axis Z) of the electron detection portion 30 increases. In the example of FIG. 4, electrons $E2_H$ having higher energies are detected at position (i,5). Electrons $E2_L$ having lower energies are detected at position (i,1). Electrons $E2_M$ having moderate energies are detected at position (i,3).

The array calculator 43 performs a calculation according to Eq. (1) above and calculates a total amount sd of electrons detected by the detector element areas 39 specified by the detector element specifying array $Ia_{ij}$.

The detector element specifying array $Ia_{ij}$ is set for each of the detector element areas 39 at which the distances from the center (optical axis Z) of the electron detection portion 30 to the positions where the electrons E2 are detected are equal, i.e., for each of the detector element areas 39 detecting electrons E2 in the same energy range.

In the example shown in FIG. 4, three detector element specifying arrays $Ia_{ij}$'s are provided for a case where detector element areas 39 (herein referred to as the first detector element specifying array) detecting the electrons $E2_H$ having high energies are specified, a case where detector element areas 39 (herein referred to as the second detector element specifying array) detecting the electrons $E2_L$ having low energies are specified, and a case where the detector element areas 39 (herein referred to as the third detector element specifying array) detecting the electrons $E2_M$ having moderate electrons are specified. The user selects a desired detector element specifying array $Ia_{ij}$ via the manual control portion 52 according to the energy range of the electrons E2 to be detected.

In particular, the first detector element specifying array $Ia_{ij}$ for specifying detector element areas 39 for detecting the electrons $E2_H$ having high energies is 1 in a case where j=5 and is 0 in cases where j is not equal to 5.

Accordingly, if the first detector element specifying array $Ia_{ij}$ is selected, Eq. (1) above is expressed by the following Eq. (2).

$$sd_5 = \sum_{j=1}^{j=5} \sum_{j=1}^{i=n} Id_{ij} Ia_{ij} = \sum_{i=1}^{i=n} Id_{i5} \qquad (2)$$

In this way, by selecting the first detector element specifying array $Ia_{ij}$, it is possible to specify the detector element area or areas 39 for detecting the electrons $E2_H$ having higher energies from the detector element distribution array $Id_{ij}$. In this case, the array calculator 43 performs a calculation of Eq. (2) above and calculates the total amount sd5 of electrons detected by the detector element areas 39 specified by the first detector element specifying array $Ia_{ij}$.

Where j=1, the second detector element specifying array $Ia_{ij}$ specifying the detector element area 39 for detecting the electrons $E2_L$ having low energies is equal to 1. Where j is not equal to 1, this array is 0.

Accordingly, if the second detector element specifying array $Ia_{ij}$ is selected, Eq. (1) is given by the following Eq. (3).

$$sd_1 = \sum_{j=1}^{j=5} \sum_{j=1}^{i=n} Id_{ij} Ia_{ij} = \sum_{i=1}^{i=n} Id_{i1} \qquad (3)$$

In this way, by specifying the second detector element specifying array $Ia_{ij}$, it is possible to specify the detector element area 39 for detecting the electrons $E2_L$ having lower energies from the detector element distribution array $Id_{ij}$. When the second detector element specifying array $Ia_{ij}$ is specified, the array calculator 43 performs a calculation according to Eq. (3) and calculates the total amount sd1 of electrons detected by the detector element area 39 specified by the second detector element specifying array $Ia_{ij}$.

The third detector element specifying array $Ia_{ij}$ for specifying the detector element areas for detecting electrons $E2_M$ having moderate energies is 1 when j=3 and is 0 when j is not equal to 3.

Accordingly, when the third detector element specifying array $Ia_{ij}$ is selected, Eq. (1) above is given by the following Eq. (4).

$$sd_3 = \sum_{j=1}^{j=5} \sum_{j=1}^{i=n} Id_{ij} Ia_{ij} = \sum_{i=1}^{i=n} Id_{i3} \qquad (4)$$

In this way, by selecting the third detector element specifying array $Ia_{ij}$, it is possible to specify the detector element areas 39 for detecting the electrons $E2_M$ having moderate energies from the detector element distribution array $Id_{ij}$. When the third detector element specifying array $Ia_{ij}$ is selected, the array calculator 43 performs a calculation according to Eq. (4) above and calculates the total amount sd3 of electrons detected by the detector element areas 39 specified by the third detector element specifying array $Ia_{ij}$.

The scanned electron image generator 44 creates a scanned electron image, based on the amount of detection sd and the scan signal indicating an amount of scanning. In particular, in the example of FIG. 4, when the first detector element specifying array $Ia_{ij}$ is selected, the scanned electron image generator 44 creates a scanned electron image (backscattered electron image) using the amount of detection sd5 of the electrons $E2_H$ (backscattered electrons). Furthermore, when the second detector element specifying array $Ia_{ij}$ is selected, the scanned electron image generator 44 creates a scanned electron image (secondary electron image) using the amount of detection sd1 of the electrons $E2_L$ (secondary electrons). When the third detector element specifying array $Ia_{ij}$ is selected, the scanned electron image generator 44 creates a scanned electron image using the amount of detection sd3 of the electrons $E2_M$.

If plural detector element arrays $Ia_{ij}$'s are selected, the scanned electron image generator 44 generates plural scanned electron images corresponding to the selected plural detector element specifying arrays $Ia_{ij}$'s. That is, plural scanned electron images are created in one scan.

In the description of the above example, the slitted portion 103 for low angles shown in FIG. 4 is selected. In the scanning charged particle microscope 100, various scanned electron images which are different in conditions (i.e., emission angle θ of the electrons E2 and energy range) can be selected by selection of the slitted portions 101, 102, 103 in the electron angle sorting portion 10 and by selection of detector element area or areas 39 (detector element specifying area $Ia_{ij}$) in the electron detection portion 30.

Figure 8:
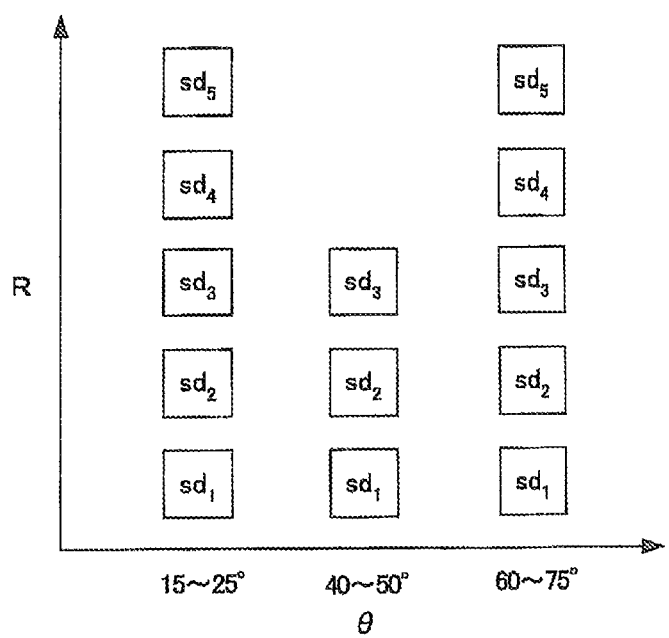
FIG. 8 shows one example of scanned electron image that can be taken by a scanning charged particle microscope according to the first embodiment.

FIG. 8 shows one example of scanned electron image that can be taken by the scanning charged particle microscope 100. In FIG. 8, the horizontal axis indicates the emission angle θ. The vertical axis indicates a position in one radial direction R in the detector element areas 39 of the electron detection portion 30. In FIG. 8, it is assumed that each detector element area 39 is divided into five squares in the radial direction R. In FIG. 8, each one square indicates one scanned electron image. An amount of detection, sd, put in the square indicates an amount of detection, sd, used to create this scanned electron image.

The scanning charged particle microscope 100 can obtain various scanned electron images (13 types of scanned electron images in the illustrated example) under various operating conditions such as emission angle θ of electrons E2 and energy range by selective use of the slitted portions 101, 102, 103 of the electron angle sorting portion 10 and selective use of the detector element areas 39 (detector element specifying array $Ia_{ij}$) of the electron detection portion 30.

Figure 9:
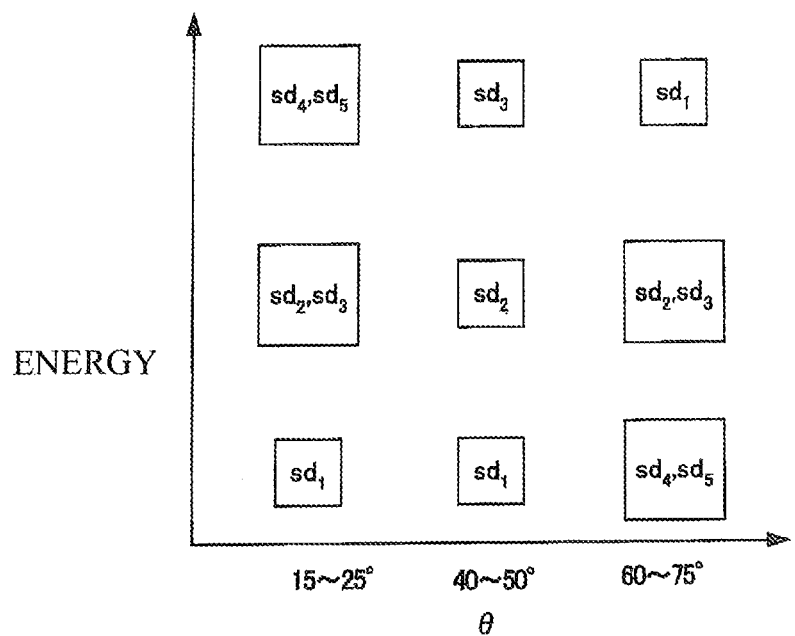
FIG. 9 shows another example of scanned electron image that can be taken by the scanning charged particle microscope according to the first embodiment.

FIG. 9 shows another example of scanned electron image that can be taken by the scanning charged particle microscope 100. In FIG. 9, the horizontal axis indicates the emission angle θ. The vertical axis indicates the energy of electrons E2 released from the sample S. In FIG. 9, each one square represents one scanned electron image. An amount of detection, sd, put in the square indicates an amount of detection, sd, used to create the scanned electron image.

In the scanning charged particle microscope 100, the amounts of detection sd detected by the detector element areas 39 having different distances in the radial direction R are summed up to create various scanned electron images under different operating conditions (i.e., emission angle θ and energy range). Furthermore, energy ranges can be made uniform among different emission angles θ by summing up amounts of detection, sd, detected by detection element areas 39 at different distances in the radial direction R. Consequently, it is possible to compare scanned electron images of detected electrons E2 which are in the same energy range but different in emission angle θ.

In this way, with the scanning charged particle microscope 100, scanned electron images arising from electrons E2 which are in the same energy range but have been emitted at different emission angles θ can be compared. Also, scanned electron images arising from electrons E2 which have been emitted at the same emission angle θ but which are in different energy ranges can be compared.

The scanning charged particle microscope 100 has the following features.

In the scanning charged particle microscope 100, the electron angle sorting portion 10 sorts out the electrons E2 released at given emission angles. The electron deflector 20 generates a deflecting field such that the electrons E2 sorted out by the electron angle sorting portion 10 are deflected according to the energies of the electrons E2. Therefore, the emission angles of the electrons E2 released from the sample S and the energies of the electrons E2 can be selectively detected, and images can be created based on the selected emission angles and the amounts of electrons detected. Consequently, the user can select energy and emission angle of the detected electrons E2 according to the purpose. In this way, scanned electron images that the user wants to observe such as contrast images where the sample composition has been emphasized and contrast images where morphological features have been emphasized can be obtained.

Furthermore, the scanning charged particle microscope 100 permits one to know how the energies and emission angles of the electrons E2 generated by irradiation by the electron beam E1 are involved in information about the material and state of the sample.

According to the scanning charged particle microscope 100, if plural detector element specifying arrays $Ia_{ij}$'s are specified, different scanned electron images arising from different energy ranges can be created in one scan. Therefore, when it is desired to obtain a scanned electron image under plural conditions, the dose of the electron beam E1 on the sample S can be suppressed.

In the scanning charged particle microscope 100, the electron angle sorting portion 10 is the plate-like member 16 having the through-holes 12 for permitting passage of the electron beam E1 and the slits 14 for permitting passage of the electrons E2 emitted at the given emission angles θ. Consequently, electrons released at the given emission angles θ can be sorted out.

In the scanning charged particle microscope 100, the electron deflector 20 has the electrodes 21 and 22 producing a static electric field in the path of the electrons E2 sorted out by the electron angle sorting portion 10. These electrons E2 can be deflected according to their energy by the static electric field between the electrodes 21 and 22.

According to the image acquisition method associated with the present embodiment, the electrons E2 released at the given emission angles are sorted out. The sorted electrons E2 are deflected according to the energies of the electrons E2 by producing a deflecting field. The deflected electrons E2 are detected. An image is created according to the results of the detection. Thus, the user can select energy and emission angle of the detected electrons E2 according to the purpose. In consequence, a contrast image in which the composition of the sample has been emphasized can be obtained. Also, a contrast image in which morphological features have been emphasized can be derived. Other scanned electron images that the user wants to observe can be derived.

1.3. Modifications

Modifications of the scanning charged particle microscope 100 associated with a first embodiment are next described. In the following description, only the differences with the aforementioned scanning charged particle microscope 100 are described; a description of similarities is omitted.

(1) First Modification

Figure 10:
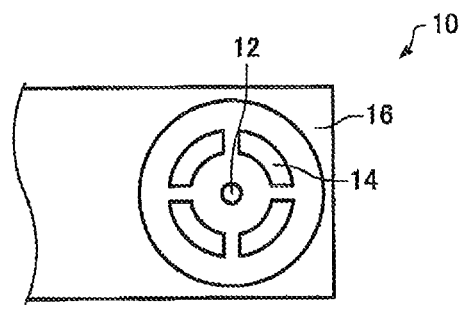
FIG. 10 is a schematic plan view of an electron angle selecting portion associated with a first modification of the first embodiment.
Figure 11:
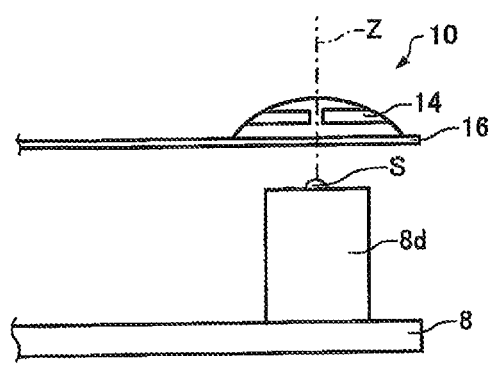
FIG. 11 is a schematic side elevation of the electron angle sorting portion shown in FIG. 10.

A first modification is described by referring to FIGS. 10 and 11 which are schematic views of the electron angle sorting portion 10 associated with the first modification. FIG. 10 is a plan view of the electron angle sorting portion 10, as viewed from the direction of the optical axis Z. FIG. 11 is a side elevation of the electron angle sorting portion 10, as viewed from a direction perpendicular to the optical axis Z.

In the electron angle sorting portion 10 of the above-described embodiment, the plate-like member 16 has the through-holes 12 and the slitted portions 14 as shown in FIG. 2.

In contrast, in the electron angle sorting portion 10, the plate-like member 16 has a semispherical part provided with through-holes 12 and slitted portions 14. In this way, no restrictions are imposed on the shape of the electron angle sorting portion 10 as long as electrons E2 released at the given emission angles θ can be sorted out.

In the illustrated example, the sample S is placed on a support plate 8d that is mounted on the sample stage 8. This support plate is used to bring the electron angle sorting portion 10 close to the sample S. That is, the plate is used to reduce the distance between the sample S and the slitted portion 14.

(2) Second Modification

Figure 12:
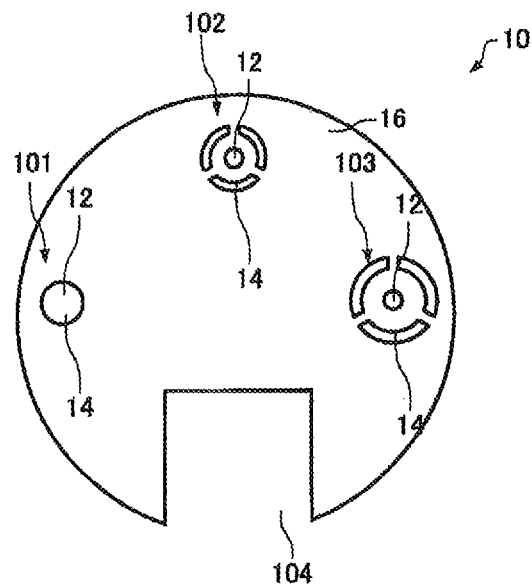
FIG. 12 is a schematic plan view of an electron angle sorting portion associated with a second modification of the first embodiment.
Figure 13:
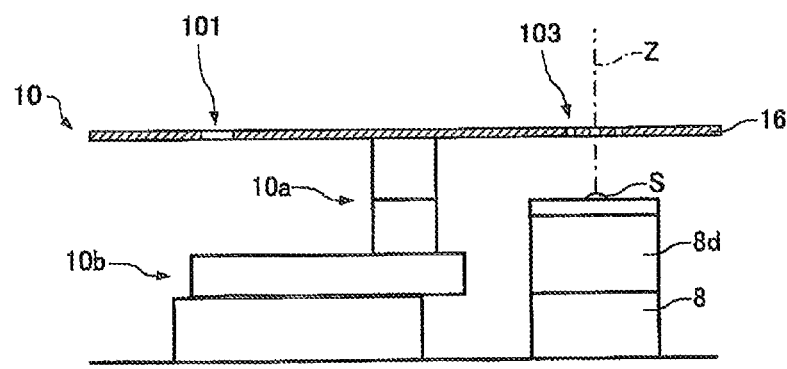
FIG. 13 is a side elevation, partly in cross section, of the electron angle sorting portion shown in FIG. 12.

A second modification is next described by referring to FIGS. 12 and 13, which are schematic representations of an electron angle sorting portion 10 associated with the second modification. FIG. 12 is a plan view of the electron angle sorting portion 10, as viewed from the direction of the optical axis Z. FIG. 13 is a cross section of the electron angle sorting portion 10, as viewed in a direction perpendicular to the optical axis Z.

As shown in FIG. 2, in the electron angle sorting portion 10 of the above-described embodiment, the plate-like member 16 is rectangular in planar form. The plate-like member 16 is provided with the slitted portions 101, 102, and 103 along the longer sides of the plate-like member.

In contrast, in the electron angle sorting portion 10 of the present modification, as shown in FIG. 12, the plate-like member 16 is disklike in planar form and provided with slitted portions 101, 102, and 103 along its circumference.

In the present modification, as shown in FIG. 13, the electron angle sorting portion 10 switches the operative slitted portion among the slitted portions 101, 102, and 103 using a rotary drive portion 10a and a translational drive portion 10b. The rotary drive portion 10a can rotate the plate-like member 16 about the center of the plate-like member 16. The rotary drive portion 10a is mounted on the translational drive portion 10b. The translational drive portion 10b can translate the slitted portions 101, 102, and 103 by linearly moving the rotary drive portion 10a. The operative slitted portion can be switched among the slitted portions 101, 102, and 103 by operation of the rotary drive portion 10a and translational drive portion 10b. These drive portions 10a and 10b are under control of the controller 45.

As shown in FIG. 12, the plate-like member 16 has a slitted portion 104, which is used when electrons are not sorted out according to the emission angle θ.

(3) Third Modification

Figure 14:
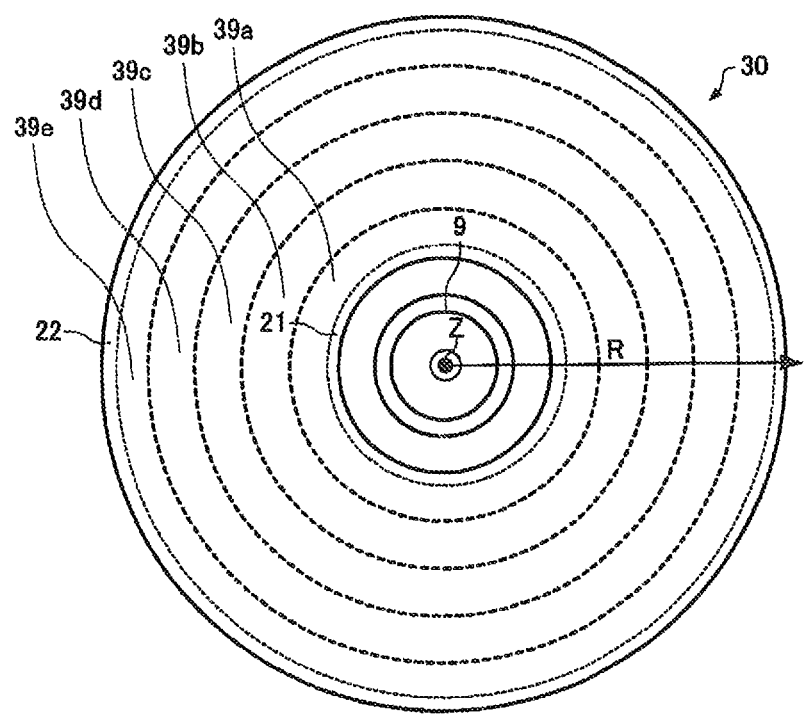
FIG. 14 is a plan view of an electron detection portion associated with a third modification of the first embodiment.

A third modification is next described by referring to FIG. 14, which is a schematic plan view of an electron detection portion, 30, associated with the third embodiment, as viewed from the direction of the optical axis Z.

The electron detection portion 30 of the above-described embodiment is a two-dimensional detector having position resolution within the plane perpendicular to the optical axis Z as shown in FIG. 7.

In contrast, in the present modification, as shown in FIG. 14, the electron detection portion 30 has a plurality of (five in the illustrated example) detector element areas 39a, 39b, 39c, 39d, and 39e arranged along the direction (radial directions R) in which the electrons E2 are deflected by the deflecting field. In the electron detection portion 30, each of the detector element areas 39a, 39b, 39c, 39d, and 39e can detect the electrons E2.

Each of the detector element areas 39a-39e is formed annularly about the optical axis of the electron beam E1, i.e., about the optical axis Z of the scanning charged particle microscope 100. The electrons E2 can be detected in every angular position about the optical axis Z and so a large number of electrons E2 can be detected. Hence, a scanned electron image with high S/N can be obtained.

In the present modification, the aforementioned detection element specifying array $Ia_{ij}$ is indicated by a detection element specifying array $Ia_j$, where j is a coordinate in a radial direction R of a detection element area 39 of the electron detection portion 30.

(4) Fourth Modification

Figure 15:
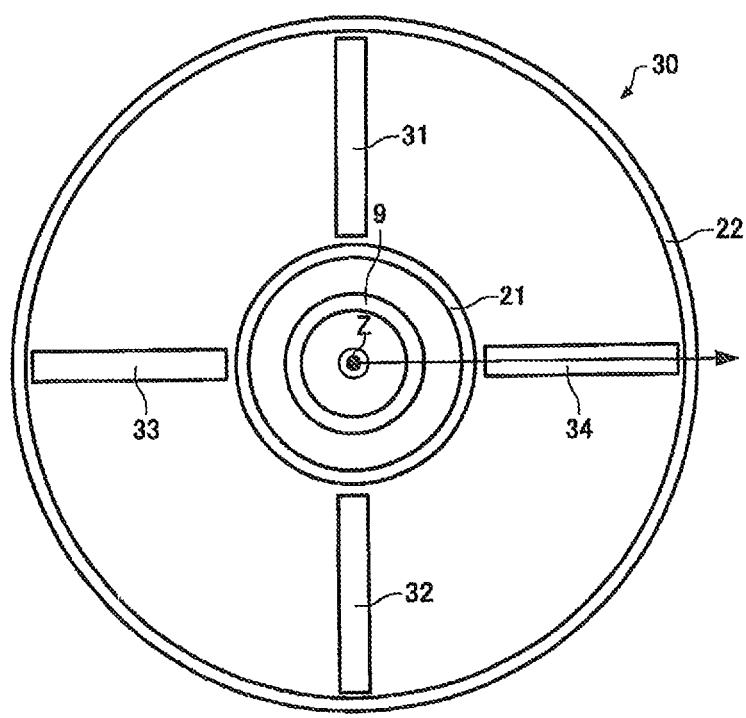
FIG. 15 is a plan view of an electron detection portion associated with a fourth modification of the first embodiment.

A fourth embodiment is next described by referring to FIG. 15, which is a schematic plan view of the electron detection portion 30 associated with the fourth modification, as viewed from the direction of the optical axis Z of the electron detection portion 30.

The electron detection portion 30 of the above-described embodiment is a two-dimensional detector as shown in FIG. 7.

In contrast, the electron detection portion 30 of the present modification has a first one-dimensional detector 31 extending in a radial direction R about the optical axis Z of the electron beam E1 and a second one-dimensional detector 32 as shown in FIG. 15. The first detector 31 and second detector 32 are arranged symmetrically with respect to the optical axis Z of the electron beam E1. The radial direction R is the direction in which the electrons E2 are deflected by the deflecting field.

For example, each of the one-dimensional detectors 31 and 32 has a plurality of detector elements arranged in a linear direction along which the one-dimensional detector 31 or 32 extends. Therefore, the one-dimensional detectors 31 and 32 have position resolution in the radial direction R.

Furthermore, the electron detection portion 30 has a third one-dimensional detector 33 extending in another radial direction R about the optical axis Z of the electron beam E1 and a fourth one-dimensional detector 34. The third detector 33 and fourth detector 34 are arranged symmetrically with respect to the optical axis Z of the electron beam E1. In the illustrated example, these one-dimensional detectors 31, 32, 33, and 34 are arranged at intervals of 90 degrees about the optical axis Z.

In this way, the one-dimensional detectors 31, 32, 33, and 34 are arranged with good symmetry and so the electrons E2 released from the sample S can be detected with good symmetry. In addition, topographical information about the sample S can be obtained. Further, according to the present modification, a space to receive an EDS (energy dispersive X-ray spectrometer) or an E-T detector can be secured between the one-dimensional detectors 31, 32, 33, and 34.

(5) Fifth Modification

Figure 16:
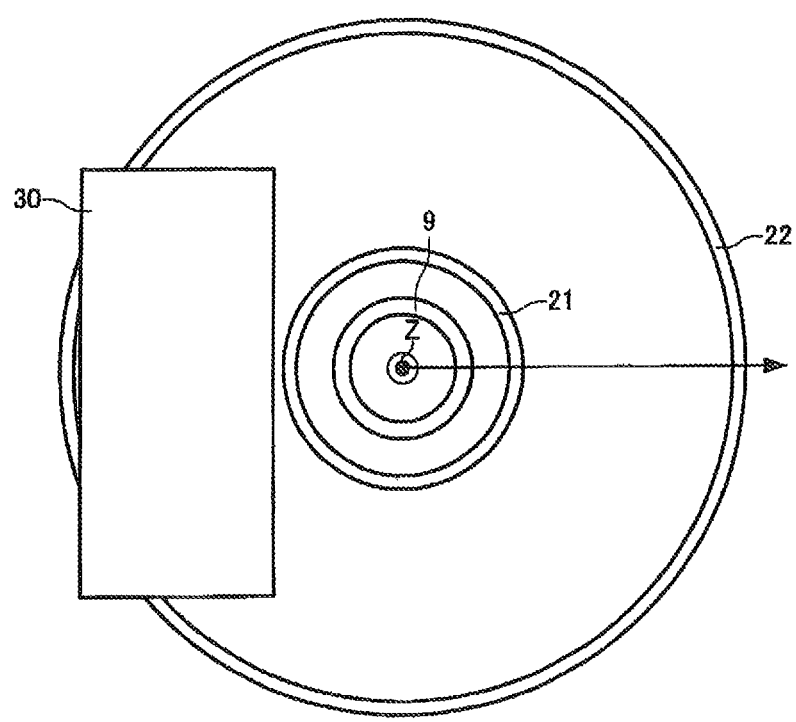
FIG. 16 is a plan view of an electron detection portion associated with a fifth modification of the first embodiment.

A fifth modification is next described by referring to FIG. 16, which shows the configuration of an electron detection portion 30 associated with the fifth modification. FIG. 16 is a plan view of the electron detection portion 30, as viewed from the direction of the optical axis Z.

As shown in FIG. 7, the electron detection portion 30 of the above-described embodiment is mounted to fill up the whole space between the inner electrode 21 and outer electrode 22, as viewed from the direction of the optical axis Z. That is, the electron detection portion 30 is mounted circumferentially entirely around the optical axis Z.

In contrast, as shown in FIG. 16, the electron detection portion 30 of the present modification is provided in a part of the region between the inner electrode 21 and the outer electrode 22, as viewed from the direction of the optical axis Z. That is, the electron detection portion 30 of the present modification is provided on only one side of the optical axis Z. Consequently, it is possible to secure a space to receive an EDS or an E-T detector.

2. Second Embodiment

2.1. Configuration of Scanning Charged Particle Microscope

Figure 17:
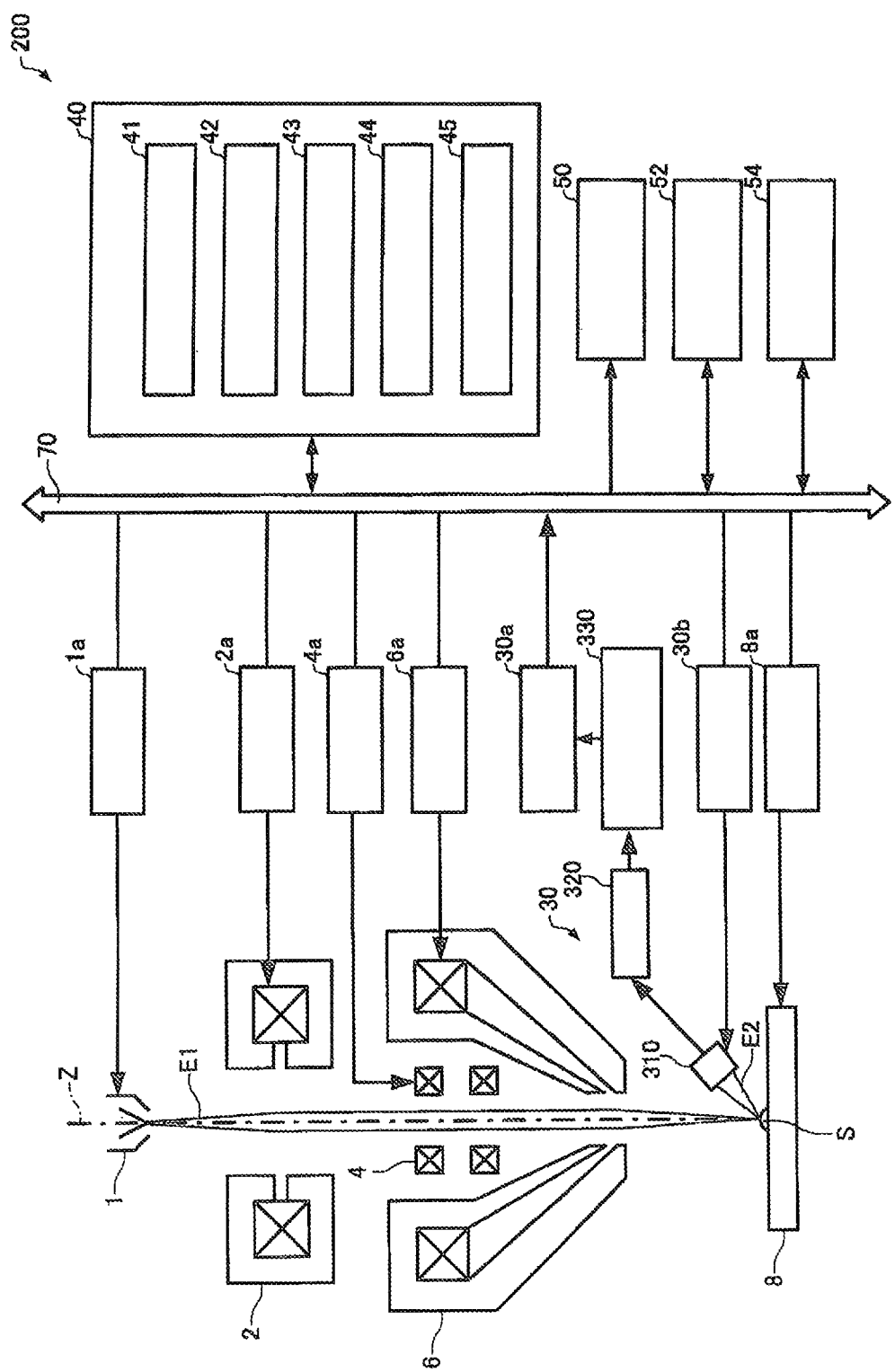
FIG. 17 is a block diagram of a scanning charged particle microscope associated with a second embodiment.
Figure 18:
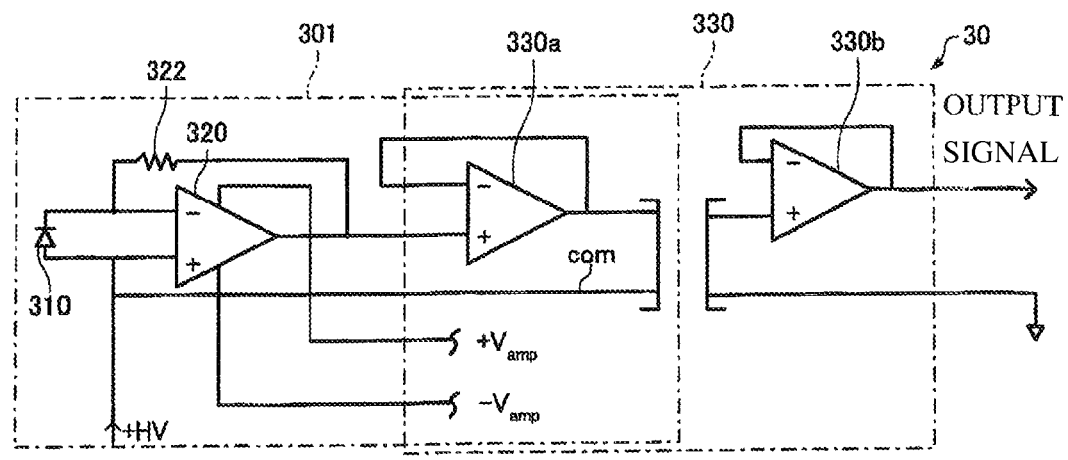
FIG. 18 is a circuit diagram of an electron detection portion of the scanning charged particle microscope shown in FIG. 17.

The configuration of a scanning charged particle microscope associated with a second embodiment is next described by referring to FIGS. 17 and 18. FIG. 17 shows the configuration of the scanning charged particle microscope, 200, associated with the second embodiment. FIG. 18 is a circuit diagram showing the circuit configuration of an electron detection portion 30 included in the microscope 200.

Those components of the scanning charged particle microscope 200 associated with the second embodiment which are identical in function with their respective counterparts of the scanning charged particle microscope 100 of the above-described first embodiment are indicated by the same reference numerals as in the above referenced figures and a description thereof is omitted.

As shown in FIG. 17, the scanning charged particle microscope 200 is configured including an electron beam source (source of charged particles) 1, condenser lenses 2, a scanning deflector 4, an objective lens 6, a sample stage 8, an electron detection portion 30, signal processing circuitry 40, a display portion 50, a manual control portion 52, and a storage portion 54.

As shown in FIGS. 17 and 18, in the scanning charged particle microscope 200, electrons E2 are detected by applying a secondary electron detecting voltage +I-IV to a semiconductor detector 310 of the electron detection portion 30.

As shown in FIGS. 17 and 18, the electron detection portion 30 is configured including an I-V amplifier 320 and an isolated amplifier 330, as well as the semiconductor detector 310.

The semiconductor detector 310 detects the electrons E2. In particular, the semiconductor detector 310 is a device for outputting a current value or output voltage corresponding to the amount of incident electrons E2. For example, the semiconductor detector 310 is a P-N junction silicon photodiode. Note that the semiconductor detector 310 is not restricted to photodiodes. Any detector may be used as long as it outputs a current or voltage signal responsive to the amount of incident electrons E2. When the electrons E2 enter a silicon photodiode, carriers are generated in it. Since the carriers are moved to electrodes, they can be extracted as an electrical current.

The secondary electron detecting voltage +HV is applied to the semiconductor detector 310 to detect secondary electrons. The whole semiconductor detector 310 can be placed at a high positive potential by applying the secondary electron detecting voltage +HV to the semiconductor detector 310. Consequently, electrons are accelerated and enter the semiconductor detector 310. Thus, the electrons E2 of low energies such as secondary electrons can be detected. The secondary electron detecting voltage +HV is, for example, between 0.5 kV and 3 kV, inclusively.

The output of the semiconductor detector 310 is connected with the I-V amplifier 320. The output current from the semiconductor detector 310 is converted into a voltage signal, amplified, and output. A well-known I-V amplifier can be used as the I-V amplifier 320.

The I-V amplifier 320 is connected with the isolated amplifier 330 having an input portion 330a and an output portion 330b which are electrically isolated from each other. The isolated amplifier 330 passes only signals. In the isolated amplifier 330, a photocoupler is used between the input portion 330a and the output portion 330b to permit passage of only signals while electrically isolating the input portion 330a and output portion 330b from each other.

Figure 19:
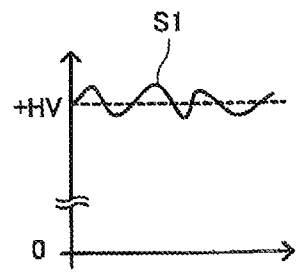
FIG. 19 is a graph showing a signal S1 applied to an isolated amplifier shown in FIG. 18.
Figure 20:
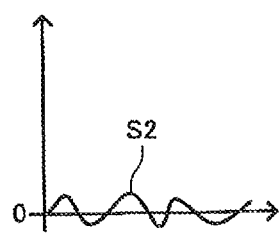
FIG. 20 is a graph showing a signal S2 output from the isolated amplifier.

FIG. 19 is a graph showing a signal 51 applied to the isolated amplifier 330. FIG. 20 is a graph showing a signal S2 delivered from the isolated amplifier 330. In each graph of FIGS. 19 and 20, the horizontal axis indicates time. The vertical axis indicates voltage. As shown in FIGS. 19 and 20, if the secondary electron detecting voltage +HV is applied to the semiconductor detector 310, the output signal can be extracted as a ground level signal (e.g., 0V) because of the use of the isolated amplifier 330. In this way, in the electron detection portion 30, the reference potential for the input portion 330a to which a signal is applied is higher than the reference potential for the output signal 330b from which an output signal is provided.

When the secondary electron detecting voltage +HV is applied to the common terminal (coin) of a high voltage portion 301 on the input side of the isolated amplifier 330, the whole high voltage portion 301 is kept at a high potential. Therefore, the semiconductor detector 310 is also placed at a high potential. In this case, the both terminals of the semiconductor detector 310 (i.e., the anode and cathode of the photodiode) are placed at high potentials. This prevents application of a high voltage across the semiconductor detector 310. Hence, it is unlikely that the semiconductor detector 310 will be destroyed due to a high potential difference.

A power supply for operating the I-V amplifier 320 is provided, for example, from the isolated amplifier 330. The output voltage from the I-V amplifier 320 provides $-V_{amp}$ and $+V_{amp}$ to the potential of the common terminal of the input side of the isolated amplifier 330 and so the I-V amplifier 320 can be operated at high potentials.

The secondary electron detecting voltage +HV is applied from a driver portion 30b (see FIG. 17). The driver portion 30b applies the secondary electron voltage +HV on the basis of a control signal from the controller 45. The control signal contains information about the magnitude of the secondary electron detecting voltage +HV.

The secondary electron detecting voltage +HV is set to such a value that the electrons E2 are accelerated, for example, up to an electron energy that can be detected by the semiconductor detector 310. For example, where the semiconductor detector 310 can detect electrons having energies of 2 keV or higher, the secondary electron detecting voltage +HV is 2 kV or higher. The lower limit of the electron energy range that can be detected can be varied by varying the magnitude of the secondary electron detecting voltage +HV applied to the semiconductor detector 310. The magnitude of the secondary electron detecting voltage +HV is appropriately set according to the performance of the semiconductor detector 310, the gain of the amplifier, response speed, and other factors. The magnitude of the secondary electron detecting voltage +HV may be previously set or set by the user.

The secondary electron detecting voltage +HV is set to a voltage (e.g., a voltage of 2 kV if electrons of 2 keV or higher can be detected) at which the electrons E2 are accelerated up to an energy that can be detected in accordance with the specifications of the semiconductor detector.

The photodiode for detecting electrons in the scanning electron microscope is used generally for the purpose of detection of backscattered electrons and so the specifications for the photodiode are indicated by an energy capable of being detected by backscattered electrons. With such a photodiode, if the energy of incident electrons is lower than the energy indicated in the specifications, the amount of generated carriers is small. A sufficient amount of electric current is not output as a signal and thus cannot be detected. However, where the secondary electron accelerating voltage +HV is applied to such a photodiode and secondary electrons are detected, even if the energy of the accelerated secondary electrons is lower than the energy indicated in the specifications, a sufficient amount of output current may be obtained as a signal because the amount of secondary electrons produced by irradiating the sample with an electron beam is much greater than the amount of produced backscattered electrons. That is, in a photodiode, if the amount of carriers produced per electron is small, the amount of incident secondary electrons is greater and so a sufficient amount of output signal is obtained. For example, where a voltage of 1 kV is applied to a photodiode capable of detecting backscattered electrons having energies of 2 keV or higher, secondary electrons which have energies lower than the energy indicated in the specifications are accelerated to about 1 keV and thus such low-energy secondary electrons are detected.

In the scanning charged particle microscope 200, the secondary electron detecting voltage +HV is applied to the semiconductor detector 310 to detect secondary electrons. Consequently, the electrons E2 are accelerated by the secondary electron detecting voltage +HV applied to the semiconductor detector 310 and enter the detector 310. Therefore, even secondary electrons having low energies can be detected by the semiconductor detector 310. Furthermore, in the scanning charged particle microscope 200, the range (lower limit) of the energies of the electrons E2 capable of being detected can be varied by changing the magnitude of the secondary electron detecting voltage +HV. In consequence, the electrons E2 are selectively detected and imaged.

The electron detection portion 30 uses the isolated amplifier 330 and so the output signal can be extracted as a ground level signal (see FIG. 20). Where the output signal from the isolated amplifier 330 is weak, an additional amplifier (not shown) may be added and the signal may be amplified.

In the image acquisition method associated with the present embodiment, when the deflected electrons E2 are detected, the detection is carried out by using plural semiconductor elements of the detector 310 which are arranged in the direction in which the electrons E2 are deflected by the deflecting field. The secondary electron detecting voltage +HV is applied to the semiconductor detector 310 to detect secondary electrons. The electrons E2 are accelerated by the secondary electron detecting voltage +HV impressed on the semiconductor detector 310 and made to enter the detector 310. Consequently, secondary electrons having low energies can be detected by the semiconductor detector 310 and imaged.

In the electron detection method associated with the present modification, the electrons E2 released from the sample S are detected by the semiconductor detector 310 to which the secondary electron detecting voltage +HV is applied to detect secondary electrons. The electrons E2 are accelerated by the secondary electron detecting voltage +HV applied to the detector 310 and enter the semiconductor detector 310. Therefore, secondary electrons having low energies can be detected by the semiconductor detector 310. Furthermore, in the electron detection method associated with the present embodiment, a charged particle beam (electron beam E1) is directed at the sample S to release the electrons E2 from the sample S.

2.2. Modifications

Modifications of the scanning charged particle microscope 200 associated with the second embodiment are next described. In the following description, only the differences with the above-described scanning charged particle microscope 200 are described; a description of similarities is omitted.

(1) First Modification

Figure 21:
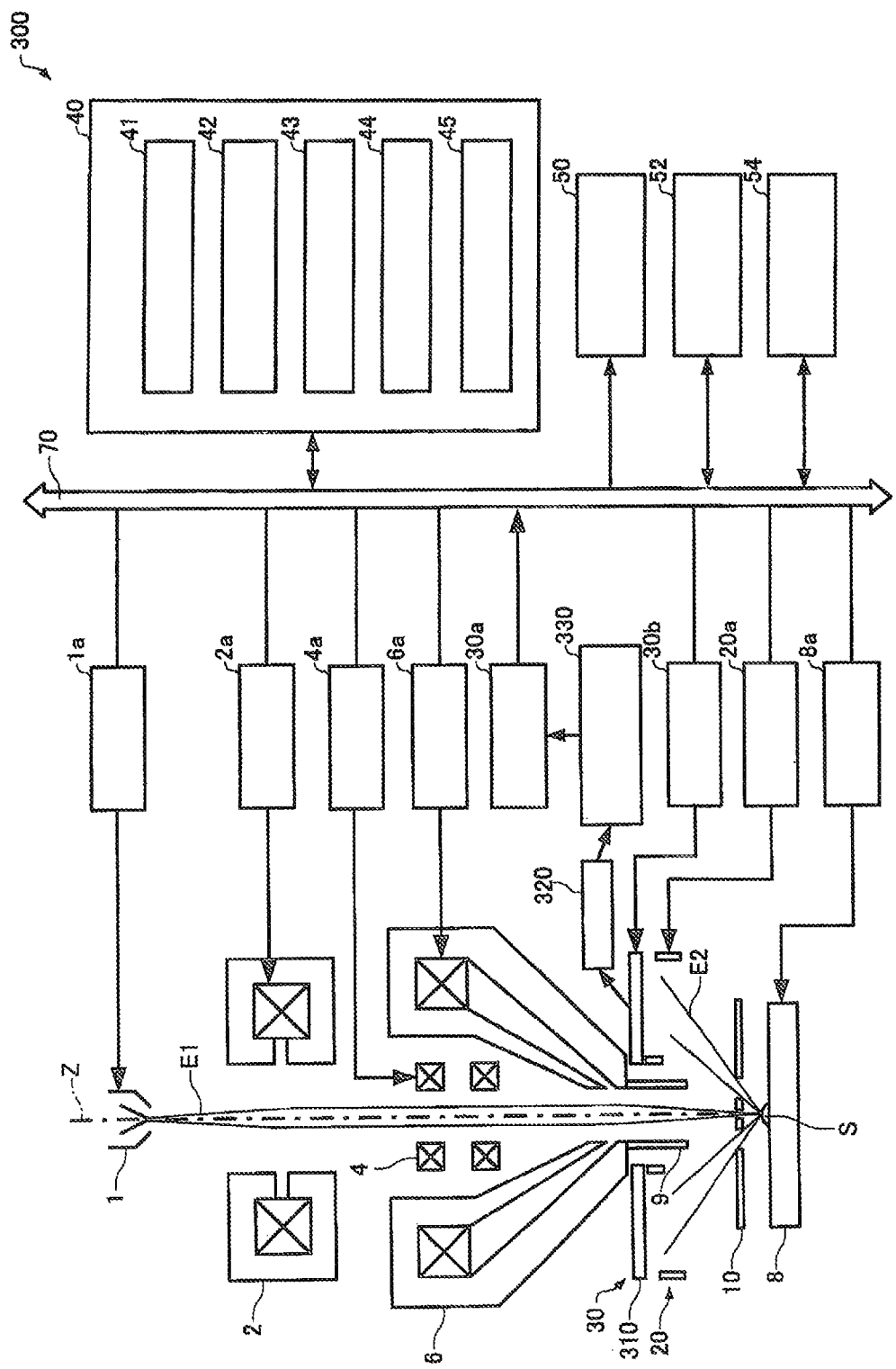
FIG. 21 is a block diagram of a scanning charged particle microscope associated with a first modification of the second embodiment.
Figure 22:
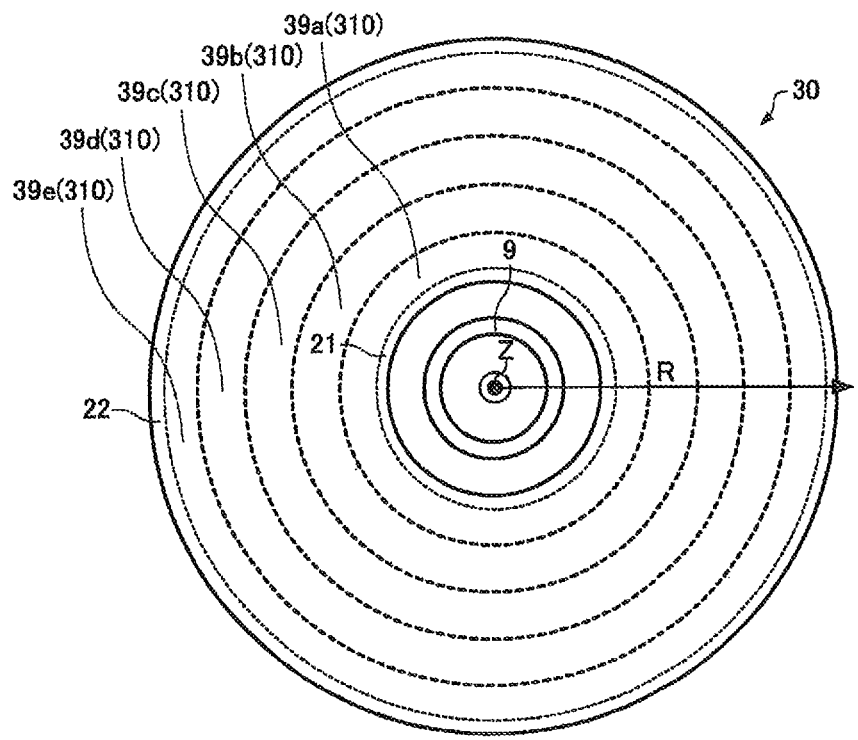
FIG. 22 is a plan view of an electron detection portion of the scanning charged particle microscope shown in FIG. 21.

A first modification is first described. FIG. 21 shows the configuration of a scanning charged particle microscope, 300, of the first modification of the second embodiment. FIG. 22 is a schematic plan view of an electron detection portion 30 of the microscope 300, as viewed from the direction of the optical axis Z.

As shown in FIG. 21, the scanning charged particle microscope 300 is configured including an electron angle sorting portion 10 and an electron deflector 20. The electron detection portion 30 has a plurality of semiconductor detectors 310 arranged in the direction in which the electrons E2 are deflected by the deflecting field. A secondary electron detecting voltage +HV is applied to the semiconductor detectors 310 to detect secondary electrons.

As shown in FIG. 22, the scanning charged particle microscope 300 has the plural (five, in the illustrated example) semiconductor detectors 310 that are arranged along the direction (radial direction R) in which the electrons E2 are deflected by the deflecting field. The semiconductor detectors 310 constitute plural (five, in the illustrated example) detector element areas 39a, 39b, 39c, 39d, and 39e. In the scanning charged particle microscope 300, each of the detector element areas 39a-39e detects the electrons E2 independently.

Substantially the same level of the secondary electron detecting voltage +HV is applied to the plural semiconductor detectors 310. Different levels of the secondary electron detecting voltage +HV may be applied to the semiconductor detectors 310.

Alternatively, the semiconductor detectors 310 may be arranged in rows and columns such that the detector element areas 39 are arranged in rows and columns (see FIG. 7).

Where the semiconductor detectors 310 are silicon photodiodes, if the same amount of electrons E2 impinges, the gain is different according to the energy of the electrons E2. Accordingly, the amounts of electrons E2 entering the semiconductor detectors 310 cannot be found unless the output current is corrected. The correction method is described below.

Figure 23:
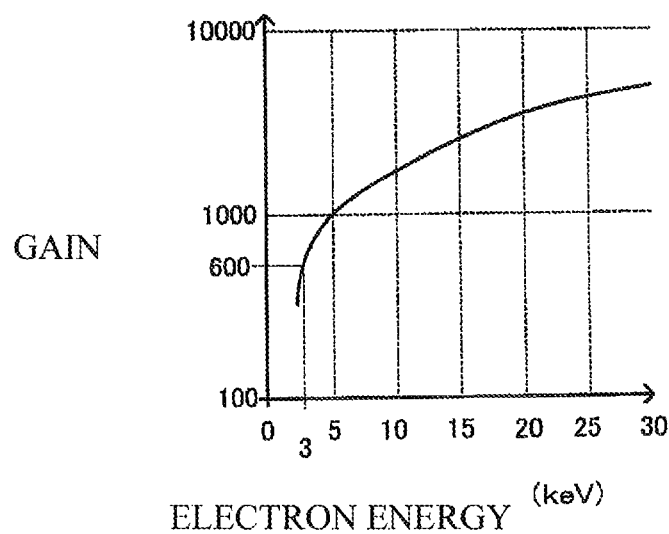
FIG. 23 is a graph showing the relationship between the gain of a silicon photodiode and electron energy.

FIG. 23 is a graph showing the relation between the gain of a silicon photodiode and electron energy. In comparing a case where electrons of 3 keV are detected by a silicon photodiode and a case where electrons of 5 keV are detected, the gain is 600 in the case of 3 keV and the gain is 1,000 in the case of 5 keV as shown in FIG. 23. Therefore, if the same value of 1 nA enters the silicon photodiode, the output current is 600 nA when electrons of 3 keV enter and 1 μA when electrons of 5 keV enter. In this way, where a silicon photodiode is used as each semiconductor detector 310, it is impossible to make precise comparisons of amounts of electrons if output current values from the semiconductor detectors 310 are compared. Accordingly, in the scanning charged particle microscope 300, the array calculator 43 calculates amounts of electrons from the results of detection performed by the semiconductor detectors 310 (i.e., output current and amount of detection) on the basis of the gains of the detectors 310 for different energies of the electrons E2. Then, the scanned electron image generator 44 creates a scanned electron image, based on the amounts of electrons.

The operation of the scanning charged particle microscope 300 is described below. It is now assumed that the accelerating voltage of the electron beam E1 is 2 kV (electron energy incident on the sample S is 2 keV). A given angular range of electrons is sorted out by the electron angle sorting portion 10 from the electrons E2 scattered and released by the sample S. The angularly sorted electrons E2 are dispersed according to energy by the deflecting field produced by the electron deflector 20. The dispersed electrons E2 are accelerated by the secondary electron detecting voltage +HV applied to the semiconductor detectors 310 and different energy ranges of electrons hit the detector element areas 39a, 39b, 39c, 39d, and 39e, respectively, of the semiconductor detectors 310.

The electron deflector 20 is set up to produce a deflecting field which causes secondary electrons $E2_L$ having energies of 50 eV or less on release from the sample S to enter the semiconductor detectors 310 constituting the detector element area 39a and backscattered electrons $E2_H$ having energies of 2 keV on release from the sample S to enter the semiconductor detector 310 constituting the detector element area 39e.

Since the electrons E2 accelerated by the secondary electron detecting voltage +HV enter the semiconductor detectors 310, it is necessary to take account of energies given by the acceleration in order to find the amounts of electrons. For example, where +3 kV is applied as the secondary electron detecting voltage +HV to the semiconductor detectors 310, the secondary electrons $E2_L$ are accelerated to about 3 keV and impinge on the detector element area 39a. Furthermore, the backscattered electrons $E2_H$ are accelerated to 5 keV and impinge on the detector element area 39e. Therefore, the array calculator 43 finds gains of the detector element areas 39a, 39b, 39c, 39d, and 39e for the energies of the electrons E2 respectively entering the detector element areas 39a, 39b, 39c, 39d, and 39e from the relations of gains of the segments of the semiconductor detectors 310 shown in FIG. 23 to energies of the electrons E2 and divides the obtained output currents by the gains, thus obtaining amounts of electrons.

Specifically, when the output current from the detector element area 39a of the semiconductor detector 310 is 600 pA, the gain of the detector 310 for the secondary electrons $E2_L$ impinging on the detector element area 39a is 600 and so the array calculator 43 finds an amount of electrons by dividing 600 pA by 600. That is, the amount of electrons in the detector element area 39a is 1 pA. Where the output current from the detector element area 39e of the semiconductor detector 310 is 1 μA, for example, the gain of the semiconductor detector 310 for the backscattered electrons $E2_H$ entering the detector element area 39e is 1000 and, therefore, the array calculator 43 finds an amount of electrons by dividing 1 μA by 1000. That is, the amount of electrons in the detector element area 39e is 1 pA.

The scanned electron image generator 44 creates scanned electron images for respective ones of the detector element areas 39a, 39b, 39c, 39d, and 39e (for different energies of the electrons E2), based on the amounts of electrons in the detector element areas 39a, 39b, 39c, 39d, and 39e calculated by the array calculator 43. As a result, scanned electron images of different energies of the electrons E2 are obtained.

In the scanning charged particle microscope 300, the electron detection portion 30 has the plurality of semiconductor detectors 310 arranged in the direction in which the electrons E2 are deflected by the deflecting field. The secondary electron detecting voltage +HV is applied to the semiconductor detectors 310 to detect secondary electrons. Consequently, the electrons E2 are accelerated by the secondary electron detecting voltage +HV applied to the semiconductor detectors 310 and made to impinge on the detectors 310. Thus, even secondary electrons having low energies can be detected by the semiconductor detectors 310.

The scanning charged particle microscope 300 includes the array calculator 43 that calculates amounts of electrons from the results of detections made by the semiconductor detectors 310, based on the gains of the detectors 310 for different energies of the electrons. The scanned electron image generator 44 creates images based on the amounts of electrons. Consequently, it is possible to make corrections on variations in gain in the semiconductor detectors 310 due to different energies of the electrons E2.

This method of calculating amounts of electrons from the results of detections performed by the semiconductor detectors 310, based on the gains of the segments of the semiconductor detectors 310 for different energy ranges of electrons, is effective where the energy ranges of the electrons E2 entering the detectors 310 are narrow because more precise values can be found. Therefore, the energy resolution provided by the electron deflector 20 is preferably enhanced in use, for example, by narrowing the slitted portions 14 (see FIG. 2) of the electron angle sorting portion 10.

(2) Second Modification

Figure 24:
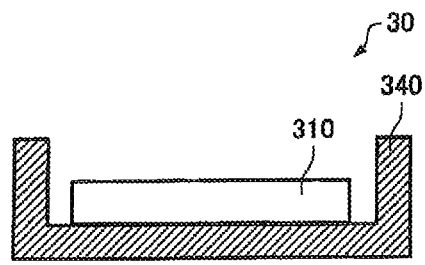
FIG. 24 is a schematic cross section of the electron detection portion of a scanning charged particle microscope associated with a second modification of the second embodiment.

A second modification is next described by referring to FIG. 24, which is a schematic cross section of the electron detection portion 30 of a scanned charged particle microscope associated with the second modification.

In the second modification, the semiconductor detectors 310 are covered with a metal plate 340 that is placed at the same potential as the detectors 310. This can prevent electrical discharging between a member (such as the objective lens 6) disposed around the semiconductor detectors 310 of the scanning charged particle microscope and the detectors 310.

In the semiconductor detectors 310, a high potential difference is developed between the member at ground potential such as the objective lens 6 and the detectors 310 because the secondary electron detecting voltage +HV is applied as described previously. Accordingly, where the metal plate 340 is not disposed, there is the possibility that an electric discharge will occur between the member at ground potential and the semiconductor detectors 310. In the present modification, however, the semiconductor detectors 310 are covered with the metal plate 340 and, therefore, if a high potential difference occurs, for example, between the objective lens 6 and the detectors 310, an electric discharge occurs between the objective lens 6 and the metal plate 340. Consequently, it is possible to prevent occurrence of an electric discharge between the objective lens 6 and the detectors 310.

(3) Third Modification

Figure 25:
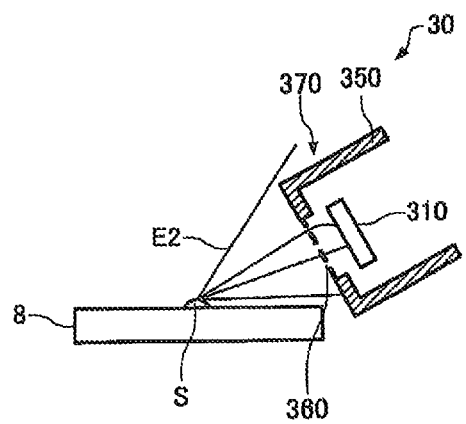
FIG. 25 is a schematic cross section of an electron detection portion of a scanning charged particle microscope associated with a third modification of the second embodiment.

A third modification is next described by referring to FIG. 25, which is a schematic cross section of the electron detection portion 30 of a scanning charged particle microscope associated with the third modification.

In the third modification, the semiconductor detectors 310 are disposed inside a package 370 composed of a metal plate 350 and a mesh 360. Ground potential is applied to both metal plate 350 and mesh 360. This can prevent the emission angles of the electrons E2 released from the sample S from being varied due to the secondary electron detecting voltage +HV applied to the semiconductor detectors 310.

Figure 26:
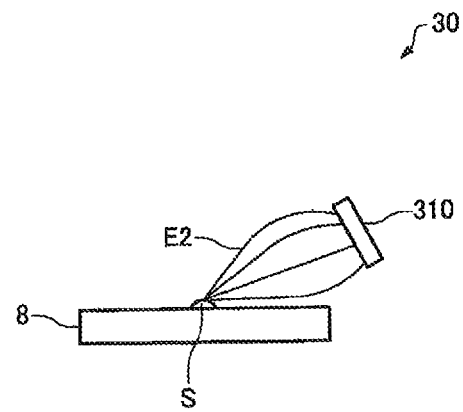
FIG. 26 shows an orbit of electrons described when no semiconductor detector is disposed within a package.

FIG. 26 shows the orbit of the electrons E2 taken when the semiconductor detectors 310 are not disposed inside the package 370. As shown in FIG. 26, when the secondary electron detecting voltage +HV is applied to the semiconductor detectors 310 without placing the detectors 310 inside the package 370, the electrons E2 released from the sample S go toward the detectors 310 while varying their orbits. This creates the problem that electrons E2 having various emission angles are detected.

In contrast, in the third modification, the semiconductor detectors 310 are accommodated within the package 370 and so such a problem does not take place. Therefore, the semiconductor detectors 310 associated with the third modification can detect the electrons E2 having low energies and electrons E2 emitted at desired emission angles.

It is to be noted that the above-described embodiments and modifications are merely exemplary and that the present invention is not restricted thereto. For example, the embodiments and modifications may be appropriately combined.

The present invention embraces configurations substantially identical (e.g., in function, method, and results or in purpose and advantageous effects) with the configurations described in the preferred embodiments of the invention. Furthermore, the invention embraces the configurations described in the embodiments including portions which have non-essential portions replaced. In addition, the invention embraces configurations which produce the same advantageous effects as those produced by the configurations described in the preferred embodiments or which can achieve the same objects as the objects of the configurations described in the preferred embodiments. Further, the invention embraces configurations which are the same as the configurations described in the preferred embodiments and to which well-known techniques have been added.

Having thus described my invention with the detail and particularity required by the Patent Laws, what is desired protected by Letters Patent is set forth in the following claims.

The invention claimed is:

1. A scanning charged particle microscope for creating an image based on electrons sorted by emission angles and energy comprising:
   a source of a charged particle beam directed along an optical axis;
   an objective lens for bringing the charged particle beam emitted from the source into focus at a sample;
   a scanning deflector for scanning the focused charged particle beam over the sample;
   a sorting portion for sorting out electrons emitted at given emission angles from electrons released from the sample in response to irradiation of the sample by the charged particle beam;
   a deflector for producing a deflecting field to deflect the sorted electrons according to emission angles to further sort according to energy of the electrons, said deflector consisting of an inner cylindrical electrode and an outer cylindrical electrode whose cylindrical axes lie on the optical axis such that deflector electrodes produce a static electric field in the path of the electrons sorted out by the emission angle sorting portion and wherein the deflecting field produced by the static electric field sorts electrons according to energy;
   a detection portion for detecting the deflected electrons; and
   an image creating portion for creating an image, based on the results of the detection performed by the detection portion.

2. The scanning charged particle microscope as set forth in claim 1, wherein said emission angle sorting portion, is a plate-like member having through-holes for permitting passage of said charged particle beam and slits for permitting passage of electrons released at said given emission angles.

3. The scanning charged particle microscope as set forth in any one of claims 1 and 2, wherein said detection portion has a plurality of detector element areas arranged in the direction in which electrons are deflected by the deflecting field.

4. The scanning charged particle microscope as set forth in claim 1, wherein said detection portion has a plurality of detector element areas arranged in the direction in which electrons are deflected by the deflecting field.

5. The scanning charged particle microscope as set forth in claim 3, wherein each of said detector element areas is shaped annularly about an optical axis of said charged particle beam.

6. The scanning charged particle microscope as set forth in any one of claims 1 and 2, wherein said detection portion has a first one-dimensional detector and a second one-dimensional detector arranged symmetrically with respect to an optical axis of the charged particle beam, the first one-dimensional detector extending in a radial directions about the optical axis of said charged particle beam, and wherein said radial direction is the direction in which electrons are deflected by said deflecting field.

7. The scanning charged particle microscope as set forth in claim 1, wherein said detection portion has a first one-dimensional detector and a second one-dimensional detector arranged symmetrically with respect to an optical axis of the charged particle beam, the first one-dimensional detector extending in a radial directions about the optical axis of said charged particle beam, and wherein said radial direction is the direction in which electrons are deflected by said deflecting field.

8. The scanning charged particle microscope as set forth in any one of claims 1 and 2, wherein said detection portion has a plurality of semiconductor detectors arranged in the direction in which electrons are deflected by said deflecting field, and wherein a secondary electron detecting voltage is applied to the semiconductor detectors to detect secondary electrons.

9. The scanning charged particle microscope as set forth in claim 1, wherein said detection portion has a plurality of semiconductor detectors arranged in the direction in which electrons are deflected by said deflecting field, and wherein a secondary electron detecting voltage is applied to the semiconductor detectors to detect secondary electrons.

10. The scanning charged particle microscope as set forth in claim 8, wherein there is further provided an arithmetic unit for calculating amounts of electrons from the results of detections performed by said semiconductor detectors, based on gains of the semiconductor detectors for different energy ranges of electrons, and wherein said image creating portion creates an image, based on the amounts of electrons.

* * * * *